(12) United States Patent
Ramer et al.

(10) Patent No.: US 9,163,802 B2
(45) Date of Patent: Oct. 20, 2015

(54) LIGHTING FIXTURES USING SOLID STATE DEVICE AND REMOTE PHOSPHORS TO PRODUCE WHITE LIGHT

(75) Inventors: David P. Ramer, Reston, VA (US); Jack C. Rains, Jr., Herndon, VA (US); Alan W. Geishecker, Woodbridge, VA (US)

(73) Assignee: ABL IP HOLDING LLC, Conyers, GA (US)

( * ) Notice: Subject to any disclaimer, the term of this patent is extended or adjusted under 35 U.S.C. 154(b) by 205 days.

(21) Appl. No.: 12/836,022

(22) Filed: Jul. 14, 2010

(65) Prior Publication Data

US 2011/0128718 A1    Jun. 2, 2011

Related U.S. Application Data

(63) Continuation-in-part of application No. 12/629,614, filed on Dec. 2, 2009.

(60) Provisional application No. 61/304,560, filed on Feb. 15, 2010.

(51) Int. Cl.
| | |
|---|---|
| *F21V 7/00* | (2006.01) |
| *F21V 9/16* | (2006.01) |
| *H01L 33/60* | (2010.01) |
| *H01L 33/64* | (2010.01) |

(52) U.S. Cl.
CPC ............... *F21V 7/0008* (2013.01); *F21V 9/16* (2013.01); *H01L 33/60* (2013.01); *H01L 33/642* (2013.01)

(58) Field of Classification Search
CPC ............... F21K 9/50; F21K 9/54; F21K 9/56
USPC ............................................ 362/84, 227, 231
See application file for complete search history.

(56) References Cited

U.S. PATENT DOCUMENTS

| | | | |
|---|---|---|---|
| 3,636,341 A | * | 1/1972 | Miller ............................. 362/263 |
| 5,502,626 A | | 3/1996 | Armstrong et al. |
| 5,549,844 A | * | 8/1996 | Bringley et al. ....... 252/301.4 H |

(Continued)

FOREIGN PATENT DOCUMENTS

| | | |
|---|---|---|
| WO | WO 01/66997 A2 | 9/2001 |
| WO | WO 2009/137053 A1 | 11/2009 |

(Continued)

OTHER PUBLICATIONS

US Office Action issued in U.S. Appl. No. 13/621,106 mailed Nov. 9, 2012.

(Continued)

*Primary Examiner* — Jong-Suk Lee
*Assistant Examiner* — Mark Tsidulko
(74) *Attorney, Agent, or Firm* — RatnerPrestia

(57) ABSTRACT

The present subject matter utilizes solid state sources to pump remote phosphors positioned within lighting fixtures to facilitate visible light illumination application in a region or area to be inhabited by a person. One or more phosphors are remotely positioned in a chamber of a lightguide element, which in some examples, substantially fills an optical volume of the fixture. The chamber includes a solid liquid or gas material for bearing the one or more phosphors. Multiple phosphors, for example, may together produce light in the fixture output that is at least substantially white and has a color rendering index (CRI) of 75 or higher.

19 Claims, 8 Drawing Sheets

(56) References Cited

U.S. PATENT DOCUMENTS

| | | | |
|---|---|---|---|
| 5,608,213 A | 3/1997 | Pinkus et al. | |
| 5,753,918 A * | 5/1998 | Pandelisev | 250/368 |
| 5,803,592 A | 9/1998 | Lawson | |
| 5,851,428 A * | 12/1998 | Matsuda et al. | 252/301.4 R |
| 5,877,490 A | 3/1999 | Ramer et al. | |
| 5,914,487 A | 6/1999 | Ramer et al. | |
| 6,007,225 A | 12/1999 | Ramer et al. | |
| 6,222,623 B1 | 4/2001 | Wetherell | |
| 6,234,648 B1 | 5/2001 | Borner et al. | |
| 6,286,979 B1 | 9/2001 | Ramer et al. | |
| 6,357,889 B1 | 3/2002 | Duggal et al. | |
| 6,361,192 B1 | 3/2002 | Fussell et al. | |
| 6,422,718 B1 | 7/2002 | Anderson et al. | |
| 6,437,861 B1 | 8/2002 | Kuta | |
| 6,447,698 B1 | 9/2002 | Ihara et al. | |
| 6,473,554 B1 | 10/2002 | Pelka et al. | |
| 6,536,914 B2 | 3/2003 | Hoelen et al. | |
| 6,566,824 B2 | 5/2003 | Panagotacos et al. | |
| 6,692,136 B2 | 2/2004 | Marshall et al. | |
| 6,700,112 B2 | 3/2004 | Brown | |
| 6,734,465 B1 | 5/2004 | Taskar et al. | |
| 6,737,681 B2 | 5/2004 | Koda | |
| 6,836,083 B2 | 12/2004 | Mukai | |
| 6,869,545 B2 | 3/2005 | Peng et al. | |
| 6,872,249 B2 | 3/2005 | Peng et al. | |
| 6,960,872 B2 | 11/2005 | Beeson et al. | |
| 6,969,843 B1 | 11/2005 | Beach et al. | |
| 6,985,163 B2 | 1/2006 | Riddle et al. | |
| 6,995,355 B2 | 2/2006 | Rains, Jr. et al. | |
| 7,025,464 B2 | 4/2006 | Beeson et al. | |
| 7,029,935 B2 | 4/2006 | Negley et al. | |
| 7,040,774 B2 | 5/2006 | Beeson et al. | |
| 7,058,103 B2 * | 6/2006 | Ishida et al. | 372/43.01 |
| 7,102,152 B2 | 9/2006 | Chua et al. | |
| 7,105,051 B2 | 9/2006 | Peng et al. | |
| 7,144,131 B2 * | 12/2006 | Rains | 362/231 |
| 7,148,632 B2 | 12/2006 | Berman et al. | |
| 7,153,703 B2 | 12/2006 | Peng et al. | |
| 7,160,525 B1 | 1/2007 | Peng et al. | |
| 7,192,850 B2 | 3/2007 | Chen et al. | |
| 7,220,039 B2 | 5/2007 | Ahn et al. | |
| 7,235,190 B1 | 6/2007 | Wilcoxon et al. | |
| 7,235,792 B2 | 6/2007 | Elofson | |
| 7,259,400 B1 | 8/2007 | Taskar | |
| 7,273,904 B2 | 9/2007 | Peng et al. | |
| 7,350,933 B2 | 4/2008 | Ng et al. | |
| 7,374,807 B2 | 5/2008 | Parce et al. | |
| 7,481,553 B2 * | 1/2009 | Kim et al. | 362/240 |
| 7,531,149 B2 | 5/2009 | Peng et al. | |
| 7,560,677 B2 | 7/2009 | Lyons et al. | |
| 7,618,157 B1 | 11/2009 | Galvez et al. | |
| 7,768,192 B2 | 8/2010 | Van De Ven et al. | |
| 7,845,825 B2 | 12/2010 | Ramer et al. | |
| 7,889,421 B2 * | 2/2011 | Narendran et al. | 359/326 |
| 8,016,470 B2 * | 9/2011 | Li et al. | 362/573 |
| 8,201,967 B2 | 6/2012 | Ramer et al. | |
| 2004/0012027 A1 * | 1/2004 | Keller et al. | 257/79 |
| 2004/0135504 A1 | 7/2004 | Tamaki et al. | |
| 2004/0151008 A1 | 8/2004 | Artsyukhovich et al. | |
| 2004/0188594 A1 | 9/2004 | Brown et al. | |
| 2004/0257807 A1 | 12/2004 | Endo et al. | |
| 2005/0093430 A1 * | 5/2005 | Ibbetson et al. | 313/501 |
| 2005/0156103 A1 * | 7/2005 | May et al. | 250/228 |
| 2005/0161586 A1 * | 7/2005 | Rains et al. | 250/214.1 |
| 2005/0279915 A1 | 12/2005 | Elofson | |
| 2006/0068154 A1 | 3/2006 | Parce et al. | |
| 2006/0072314 A1 | 4/2006 | Rains | |
| 2006/0291226 A1 | 12/2006 | Daicho et al. | |
| 2007/0024173 A1 | 2/2007 | Braune | |
| 2007/0045524 A1 | 3/2007 | Rains, Jr. et al. | |
| 2007/0051883 A1 | 3/2007 | Rains, Jr. et al. | |
| 2007/0138978 A1 | 6/2007 | Rains, Jr. et al. | |
| 2007/0170454 A1 | 7/2007 | Andrews | |
| 2007/0235639 A1 | 10/2007 | Rains, Jr. | |
| 2007/0291505 A1 | 12/2007 | Fortenberry et al. | |
| 2008/0030974 A1 | 2/2008 | Abu-Ageel | |
| 2008/0084706 A1 | 4/2008 | Roshan et al. | |
| 2008/0094835 A1 | 4/2008 | Marra et al. | |
| 2008/0106887 A1 | 5/2008 | Salsbury et al. | |
| 2008/0224025 A1 | 9/2008 | Lyons et al. | |
| 2008/0237540 A1 | 10/2008 | Dubrow | |
| 2008/0246017 A1 | 10/2008 | Gillies et al. | |
| 2008/0291670 A1 | 11/2008 | Rains | |
| 2009/0002986 A1 | 1/2009 | Medendorp, Jr. et al. | |
| 2009/0003002 A1 | 1/2009 | Sato | |
| 2009/0251884 A1 | 10/2009 | Rains | |
| 2009/0290352 A1 | 11/2009 | Wu et al. | |
| 2009/0295266 A1 | 12/2009 | Ramer et al. | |
| 2009/0296368 A1 | 12/2009 | Ramer | |
| 2010/0002414 A1 | 1/2010 | Meir et al. | |
| 2011/0127557 A1 | 6/2011 | Ramer et al. | |
| 2011/0128718 A1 | 6/2011 | Ramer et al. | |
| 2011/0175546 A1 | 7/2011 | Ramer et al. | |
| 2011/0176289 A1 | 7/2011 | Ramer et al. | |
| 2011/0176316 A1 | 7/2011 | Phipps et al. | |

FOREIGN PATENT DOCUMENTS

| | | |
|---|---|---|
| WO | WO 2009/146261 A1 | 12/2009 |
| WO | WO 2009/146262 A1 | 12/2009 |
| WO | WO 2010/012999 A2 | 2/2010 |

OTHER PUBLICATIONS

Notice of Allowance and Fee(s) Due dated Nov. 25, 2013, issued in U.S. Appl. No. 13/754,353, filed Jan. 30, 2013.

US Notice of Allowance issued in U.S. Appl. No. 12/940,634 dated Feb. 17, 2012.

US Notice of Allowance issued in U.S. Appl. No. 12/729,582 dated Mar. 2, 2012.

US Notice of Allowance issued in U.S. Appl. No. 12/729,542 dated Feb. 17, 2012.

Transmittal of International Search Report and Written Opinion of the International Searching Authority issued in International Patent Application No. PCT/US2010/058716 dated May 24, 2011.

Transmittal of International Search Report and Written Opinion of the International Searching Authority issued in International Patent Application No. PCT/US2011/024783 dated May 31, 2011.

Transmittal of International Search Report and Written Opinion of the International Searching Authority issued in International Patent Application No. PCT/US2011/024789 dated May 27, 2011.

Transmittal of International Search Report and Written Opinion of the International Searching Authority issued in International Patent Application No. PCT/US2011024787 dated May 27, 2011.

Pradhan, Narayan, et al., "An Alternative of CdSe Nanocrystal Emitters: Pure and Tunable Impurity Emissions in ZnSe Nonocrystals", Nov. 24, 2005, 127, pp. 17586-17587, J. A, Chem, Soc. Communications, web publication.

"Energy Star Program Requirements for Solid State Lighting Luminaires Eligibility Criteria—Version 1.0", Manual, Sep. 12, 2007.

Yin, Yadong and A. Paul Alivisatos, "Colloidal nanocrystal sythesis and the organic-inorganic interface", Insight Review, Sep. 25, 2005, pp. 664-670, Nature vol. 437.

"Final Report: Highly Bright, Heavy Metal-Free, and Stable Doped Semiconductor Nanophosphors for Economical Solid State Lighting Alternatives", Report, Nov. 12, 2009, pp. 1-3, National Center for Environmental Research, web publication.

"Solid State Lighting: Development of White LEDs Using Nanophosphor-InP Blends", Report, Oct. 26, 2009, p. 1, U.S. Department of Energy—Energy Efficiency and Renewable Energy, web publication.

"Solid-State Lighting: Improved Light Extraction Efficiencies of White pc-LEDs for SSL by Using Non-Toxic, Non-Scattering, Bright, and Stable Doped ZnSe Quantum Dot Nanophosphors (Phase I)", Report, Oct. 26, 2009, pp. 1-2, U.S. Department of Energy—Energy Efficiency and Renewable Energy, web publication.

"Chemistry—All in the Dope", Editor's Choice, Dec. 9, 2005, Science, vol. 310, p. 1, AAAS, web publication.

"D-dots: Heavy Metal Free Doped Semiconductor Nanocrystals", Technical Specifications, etc. Dec. 1, 2009, pp. 1-2, NN-LABS, LLC

(56) References Cited

OTHER PUBLICATIONS (Nanomaterials & Nanofabrication Laboratories), CdSe/ZnS Semiconductor Nanocrystals, web publication.
Notification Concerning International Preliminary Report on Patentability and the Written Opinion of the International Searching Authority issued in International Application No. PCT/US2010/028247 dated Jun. 14, 2012.
United States Office Action issued in U.S. Appl. No. 12/940,634 dated Mar. 22, 2011.
Notice of Allowance issued in U.S. Appl. No. 12/629,614, mailed Aug. 5, 2010.
United States Office Action issued in U.S. Appl. No. 12/729,582 dated Sep. 22, 2011.
United States Office Action issued in U.S. Appl. No. 12/940,634 dated Aug. 10, 2011.
United States Office Action issued in U.S. Appl. No. 12/729,542 dated Oct. 11, 2011.
International Preliminary Report on Patentability and Written Opinion issued in International Patent Application No. PCT/US2011/024787 dated Aug. 30, 2012.
International Preliminary Report on Patentability and Written Opinion issued in International Patent Application No. PCT/US2011/024783 dated Aug. 30, 2012.
International Preliminary Report on Patentability and Written Opinion issued in International Patent Application No. PCT/US2011/024789 dated Aug. 30, 2012.
Notice of Allowance issued in U.S. Appl. No. 12/729,542 dated Aug. 17, 2012.

* cited by examiner

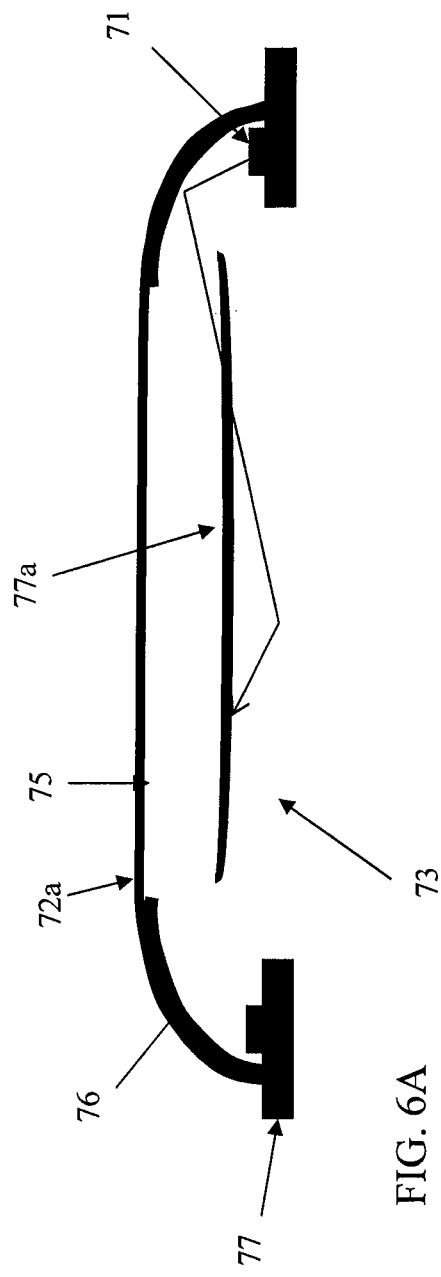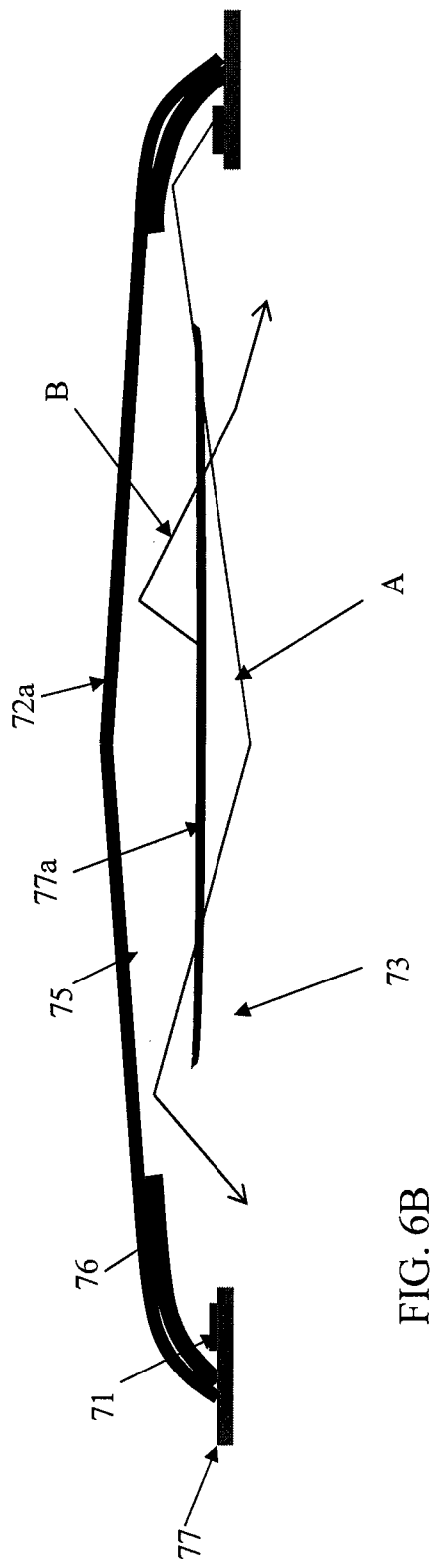
FIG. 6A
FIG. 6B ns, instrumentalities and combinations particularly pointed out in the appended claims.

LIGHTING FIXTURES USING SOLID STATE DEVICE AND REMOTE PHOSPHORS TO PRODUCE WHITE LIGHT

RELATED APPLICATIONS

This application is a continuation-in-part and claims the benefit of U.S. application Ser. No. 12/629,614, filed Dec. 2, 2009, entitled "LIGHT FIXTURE USING NEAR UV SOLID STATE DEVICE AND REMOTE SEMICONDUCTOR NANOPHOSPHORS TO PRODUCE WHITE LIGHT," the disclosure of which is entirely incorporated herein by reference.

This application also claims the benefit of U.S. Provisional Application No. 61/304,560 entitled "DYNAMIC CONTROL OF COLOR CHARACTERISTICS OF LIGHT USING SOLID STATE SOURCE AND PHOSPHORS" filed on Feb. 15, 2010, the disclosure of which is entirely incorporated herein by reference.

TECHNICAL FIELD

The present subject matter relates to lighting fixtures to produce perceptible white light, for example, for general lighting applications. The present subject matter utilizes solid state sources positioned to pump phosphors positioned within lighting fixtures to facilitate visible light illumination application in a region or area to be inhabited by a person.

BACKGROUND

As costs of energy increase along with concerns about global warming due to consumption of fossil fuels to generate energy, there is an every increasing need for more efficient as well as cost effective lighting technologies. These demands, coupled with rapid improvements in semiconductors and related manufacturing technologies, are driving a trend in the lighting industry toward the use of light emitting diodes (LEDs) or other solid state light sources to produce light for general lighting applications, as replacements for incandescent lighting and eventually as replacements for other older less efficient light sources.

The actual solid state light sources, however, produce light of specific limited spectral characteristics. To obtain white light of a desired characteristic and/or other desirable light colors, one approach uses sources that produce light of two or more different colors or wavelengths and one or more optical processing elements to combine or mix the light of the various wavelengths to produce the desired characteristic in the output light. In recent years, techniques have also been developed to shift or enhance the characteristics of light generated by solid state sources using phosphors, including for generating white light using LEDs. Phosphor based techniques for generating white light from LEDs, currently favored by LED manufacturers, include UV or Blue LED pumped phosphors.

In addition to traditional phosphors, semiconductor nanophosphors have been used more recently. The phosphor materials may be provided as part of the LED package (on or in close proximity to the actual semiconductor chip), or the phosphor materials may be provided remotely (e.g. on or in association with a macro optical processing element such as a diffuser or reflector outside the LED package). The remote phosphor based solutions have advantages, for example, in that the color characteristics of the fixture output are more repeatable, whereas solutions using sets of different color LEDs and/or lighting fixtures with the phosphors inside the LED packages tend to vary somewhat in light output color from fixture to fixture, due to differences in the light output properties of different sets of LEDs (due to lax manufacturing tolerances of the LEDs).

Although these solid state lighting technologies have advanced considerably in recent years, there is still room for further improvement. For example, there is always a need for techniques to still further improve efficiency of solid state lighting fixtures or systems, reduce energy consumption, provide desirable white light in a consistent repeatable manner from one fixture/system to the next and reduce overall costs for producing the lighting fixtures and systems.

SUMMARY

It is further desirable to provide a lighting fixture comprising a macro reflector including a diffusely reflective surface forming an optical volume. An optical aperture emits visible light out of the fixture to facilitate a visible light illumination application in a region or area to be inhabited by a person. A lightguide element substantially fills the optical volume. At least one solid state source is coupled to the lightguide element and configured to emit electromagnetic energy into the lightguide element. A chamber is disposed within the lightguide element and coupled to receive electromagnetic energy from the at least one solid state source. At least one remote phosphor is contained within the chamber at a location for excitation by the electromagnetic energy from the at least one solid state source. Each phosphor has an absorption spectrum encompassing an emission spectrum of the solid state source for emitting visible light into the optical volume. The macro reflector is positioned to receive at least some of the emitted visible light from the lightguide element and integrate the emitted visible light within the optical volume for output by way of the optical aperture.

It is further desirable to provide a lighting fixture comprising a macro reflector including a diffusely reflective surface forming an optical volume. An optical aperture emits visible light out of the fixture to facilitate a visible light illumination application in a region or area to be inhabited by a person. A lightguide element substantially fills the optical volume. A plurality of solid state sources are coupled to the lightguide element and configured to emit electromagnetic energy into the lightguide element. A chamber is disposed within the lightguide element and coupled to receive electromagnetic energy from the solid state sources. Each of the remote phosphors is contained within the chamber at a location for excitation by the electromagnetic energy from the solid state sources for emitting visible light into the optical volume. The phosphors have a respective absorption spectrum encompassing an emission spectrum of the solid state sources. A controller is coupled to each of the plurality of the solid state sources and configured to enable adjustment of intensity of the electromagnetic energy emitted by the solid state sources. The macro reflector is positioned to receive at least some of the emitted visible light from the lightguide element and integrate the emitted visible light within the optical volume for output by way of the optical aperture.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIGS. 6A and 6B illustrate yet another example of a white light emitting fixture.

DETAILED DESCRIPTION

Figure 1:
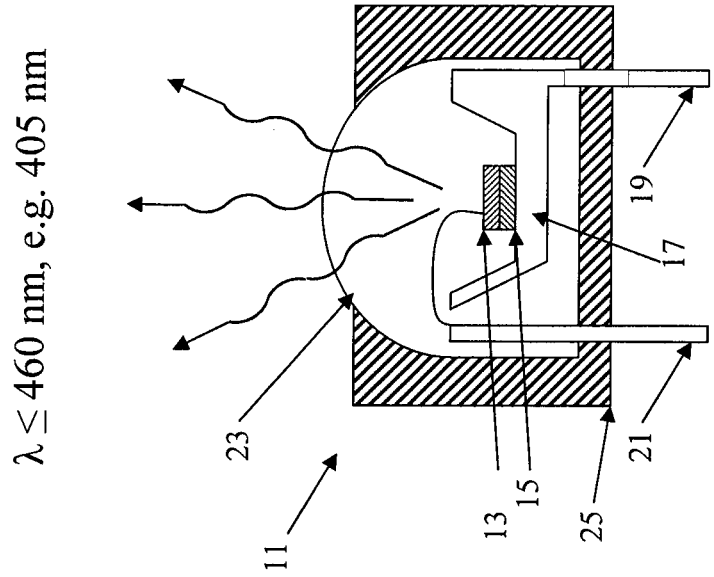
FIG. 1 is a simplified cross-sectional view of a light-emitting diode (LED) type solid state source, in this case, for emitting UV or near UV electromagnetic energy, which may be used as the solid state source for the white light fixtures and systems described herein.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The teachings herein provide further improvements over the existing technologies for providing light that is at least substantially white and address one or more of the stated needs. A semiconductor chip produces electromagnetic energy in the ultraviolet (UV) or near UV range of the electromagnetic spectrum. Remote phosphors, such as semiconductor nanophosphors (doped or non-doped semiconductor nanophosphors), are remotely positioned in an optical element, such as a light guide of a lighting fixture so as to be excited by this energy. Each phosphor is of a type or configuration such that when excited by energy in the UV or near UV range, but the phosphors together produce light in the fixture output that is at least substantially white. The simplified configuration of the fixture helps reduce overall production costs, yet still provides desirable white light in a consistent repeatable manner.

The various lighting fixtures disclosed herein relate to efficient generation and output of visible white light of characteristics that are highly desirable in general lighting applications, for example, for illumination of spaces or areas to be inhabited by people or of objects in or around such areas. For some of general white light applications, at least one semiconductor chip produces electromagnetic energy at or below 460 nm. Several more specific examples use a near UV LED type semiconductor chip rated to produce electromagnetic energy in a range of 380-420 nm, such as at 405 nm.

Phosphors, such as semiconductor nanophosphors, are remotely positioned in an optical element of a lighting fixture, for example, a light transmissive carrier material having the phosphors dispersed therein. Although in most of the specific examples, the optical element includes a lightguide element, the term "optical element" is meant to broadly encompass a wide variety of macro optical elements that may be coupled, alone or in combination with other macro elements, to process electromagnetic energy supplied by the solid state source(s).

Each of the phosphors is of a type or configuration excitable by the electromagnetic energy to produce visible light of a different spectral characteristic, having little or no overlap with spectral absorption ranges of the phosphors. When excited together, the phosphors emit light for inclusion in the fixture output, and the combined visible light output is at least substantially white and has a color rendering index (CRI) of about of 75 or higher or higher. Although sometimes referred to below simply as white light for convenience, the light produced by excitation of the phosphor is "at least substantially" white in that it appears as visible white light to a human observer, although it may not be truly white in the electromagnetic sense in that it may exhibit some spikes or peaks and/or valleys or gaps across the relevant portion of the visible spectrum.

The CIE color rendering index or "CRI" is a standardized measure of the ability of a light source to reproduce the colors of various objects, based on illumination of standard color targets by a source under test for comparison to illumination of such targets by a reference source. CRI, for example, is currently used as a metric to measure the color quality of white light sources for general lighting applications. Presently, CRI is the only accepted metric for assessing the color rendering performance of light sources. However, it has been recognized the CRI has drawbacks that limit usefulness in assessing the color quality of light sources, particularly for LED based lighting products. NIST has recently been work on a Color Quality Scale (CQS) as an improved standardized metric for rating the ability of a light source to reproduce the colors of various objects. The color quality of the white light produced by the fixtures discussed herein are specified in terms of CRI, as that is the currently available/accepted metric. Those skilled in the art will recognize, however, that the systems may be rated in future by corresponding high measures of the quality of the white light outputs using appropriate values on the CQS once that scale is accepted as an appropriate industry standard. Of course, other even more accurate metrics for white light quality measurement may be developed in future. For example, Color Quality Index (CQI) is another current metric for rating the ability of a light source to reproduce the colors of various objects.

In examples that utilize doped semiconductor nanophosphors, the light output produced during the excitation of the semiconductor nanophosphors exhibits a color temperature that will preferably be in one of the following specific ranges along the black body curve: 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; or 6,530±510° Kelvin. These color temperature ranges correspond to nominal color temperature values of 2,700° Kelvin, 3,000° Kelvin, 3,500° Kelvin, 4,000° Kelvin, 4,500° Kelvin, 5,000° Kelvin, 5,700° Kelvin, and 6,500° Kelvin, respectively. Color temperature in each of these particular ranges, for example, is highly useful, desirable and acceptable for many general lighting applications.

The lighting fixtures under consideration here may use a variety of different types of phosphors. However, it may be helpful to consider specific examples of phosphors that are believed to be suitable for producing a high spectral quality light output. Semiconductor nanophosphors are nanoscale crystals or "nanocrystals" formed of semiconductor materials, which exhibit phosphorescent light emission in response to excitation by electromagnetic energy of an appropriate input spectrum (excitation or absorption spectrum). Examples of such nanophosphors include quantum dots (q-dots) formed of semiconductor materials. Like other phosphors, quantum dots and other semiconductor nanophosphors absorb light of one wavelength band or spectrum and re-emit light at a different band of wavelengths or different spectrum. However, unlike conventional phosphors, optical properties of the semiconductor nanophosphors can be more easily tailored, for example, as a function of the size of the nanocrystals. In this way, for example, it is possible to adjust the absorption spectrum and/or the emission spectrum of a semiconductor nanophosphor by controlling crystal formation during the manufacturing process so as to change the size of the nanocrystals. For example, nanocrystals of the same material, but with different sizes, can absorb and/or emit light of different colors. For at least some semiconductor nanophosphor materials, the larger the nanocrystals, the redder the spectrum of re-emitted light; whereas smaller nanocrystals produce a bluer spectrum of re-emitted light. Doped semiconductor nanophosphors are somewhat similar in that they are nanocrystals formed of semiconductor materials. However, this later type of semiconductor nanophosphors is doped, for example, with a transition metal or a rare earth metal. The examples discussed more specifically below utilize one or mixtures of semiconductor nanophosphors. The mixtures may use three or more doped semiconductor nanophosphors, or three or more non-doped semiconductor nanophosphors. In certain examples, mixtures of four semiconductor nanophosphors, in which three of the phosphors are doped semiconductor nanophosphors and one is a non-doped semiconductor nanophosphor.

Semiconductor nanophosphors, including doped semiconductor nanophosphors, may be grown by a number of techniques. For example, colloidal nanocrystals are solution-grown, although non-colloidal techniques are possible. For a high spectral content quality type of white light application, a material containing or otherwise including a dispersion of semiconductor nanophosphors, of the type discussed in the examples herein, would contain two, three or more different types of semiconductor nanocrystals sized and/or doped so as to be excited by the light energy in the relevant part of the spectrum. The different types of nanocrystals (e.g. semiconductor material, crystal size and/or doping properties) in the mixture are selected by their emission spectra, so that together the excited nanophosphors provide light output for the system/fixture that has the spectral quality of white light for a rated color temperature, meeting the spectral quality parameters discussed herein, when all are excited by the energy from the relevant type of solid state source.

Reference is now made to FIG. 1 for a discussion of an example of a solid state source. The lighting fixtures described herein utilize a solid state source 11, for emitting electromagnetic energy of a wavelength at or below 460 nm. Of course, there may be any number of solid state sources 11 (one or more), as deemed appropriate to produce the desired level of output for the system or fixture for any particular intended lighting application. In the lighting fixtures described herein, two solid state sources are illustrated in the cross-sectional views.

The solid state source 11 is a semiconductor based structure for emitting electromagnetic energy. The structure includes a semiconductor chip, such as a light emitting diode (LED), a laser diode or the like, within a package or enclosure. A glass or plastic portion of the package that encloses the chip allows for emission of electromagnetic energy in a range at or below 460 nm in the desired direction. Many such source packages include internal or micro reflectors to direct energy in the desired direction and reduce internal losses. To provide readers a full understanding, it may help to consider a simplified example of the structure of such a solid state source 11.

FIG. 1 illustrates a simple example of LED type solid state source 11, in cross section. In the example of FIG. 1, the source 11 includes at least one semiconductor chip, each comprising two or more semiconductor layers 13, 15 forming the actual LED. The semiconductor layers 13, 15 of the chip are mounted on an internal reflective cup 17, formed as an extension of a first electrode, e.g. the cathode 19. The cathode 19 and an anode 21 provide electrical connections to layers of the semiconductor chip device within the packaging for the source 11. In the example, an epoxy dome 23 (or similar transmissive part) of the enclosure allows for emission of the electromagnetic energy from the chip in the desired direction.

In this simple example, the solid state source 11 also includes a housing 25 that completes the packaging/enclosure for the source. Typically, the housing 25 is metal, e.g. to provide good heat conductivity so as to facilitate dissipation of heat generated during operation of the LED. Internal "micro" reflectors, such as the reflective cup 17, direct energy in the desired direction and reduce internal losses. Although one or more elements in the package, such as the reflector 17 or dome 23 may be doped or coated with phosphor materials, phosphor doping integrated in (on or within) the package is not required for remote semiconductor nanophosphor implementations as discussed herein. The point here at this stage of our discussion is that the solid state source 11, in the example of FIG. 1, is rated to emit electromagnetic energy of an emission spectra within or overlapping absorption spectra of phosphors remotely deployed in a fixture, in the example, with a rated wavelength ($\lambda$) of ≤460 nm.

Semiconductor devices rated for a particular wavelength, such as the solid state sources 11, exhibit emission spectra having a relatively narrow peak at a predominant wavelength, although some such devices may have a number of peaks in their emission spectra. Often, manufacturers rate such devices with respect to the intended wavelength ($\lambda$) of the predominant peak, although there is some variation or tolerance around the rated value, from device to device. Solid state light source devices, such as device 11 can have a predominant wavelength $\lambda$ in the range at or below 460 nm ($\lambda \leq 460$ nm), for example at 405 nm ($\lambda = 405$ nm) which is in the 380-420 nm near UV range. A LED used as solid state source 11 in the example of FIG. 1 can be specifically rated for a 405 nm output, will have a predominant peak in its emission spectra at or about 405 nm (within the manufacturer's tolerance range of that rated wavelength value). The devices can have additional peaks in their emission spectra.

The structural configuration of the solid state source 11 shown in FIG. 1 is presented here by way of example only. Those skilled in the art will appreciate that the lighting systems and fixtures described herein can utilize any solid state light emitting device structure, where the device is configured as a source of electromagnetic energy of an appropriate emission spectrum.

Figures 2A, 2B:
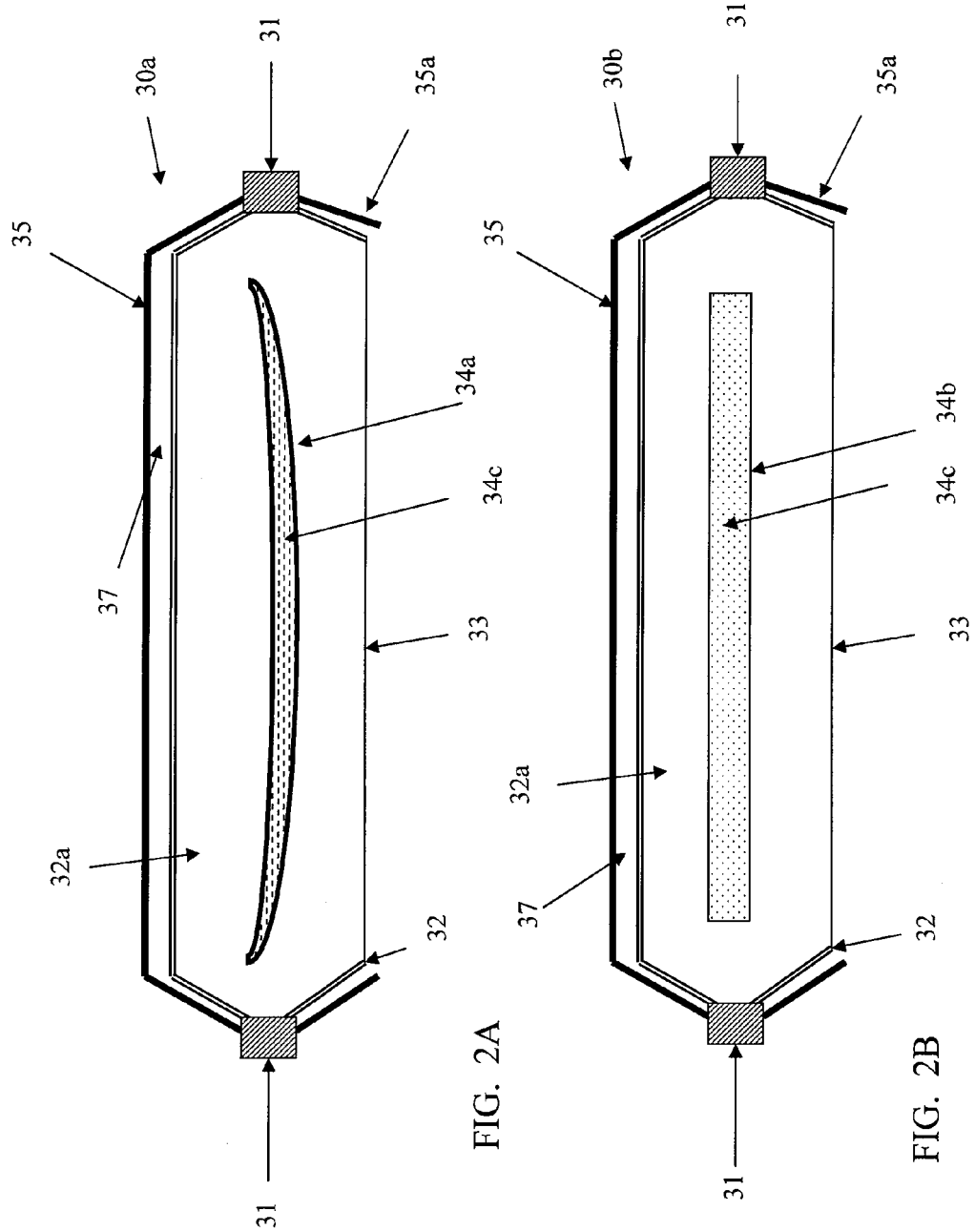
FIGS. 2A and 2B illustrate examples of white light emitting fixtures, with certain elements shown in cross section.

FIGS. 2A and 2B are simplified illustrations of lighting fixtures 30a, 30b, respectively, for emitting visible, substantially white light, so as to be perceptible by a person. A fixture portion of an overall system is shown in cross-section (although some cross-hatching thereof has been omitted for ease of illustration). An example of circuit elements for driving the solid state sources 31 in another lighting fixture example is shown in functional block form in FIG. 4. It should be noted that one or more solid state sources, such as that described in FIG. 1, can be used in the systems and fixtures described herein.

The lighting fixtures 30a, 30b utilize a lightguide element 32a, an optical volume 37, phosphor containment vessel/chamber 34a, 34b, optical aperture 33, and cladding layer 32, together with the solid state sources 31 to form a light fixture. The light fixture could be configured for a general lighting application. Examples of general lighting applications include downlighting, task lighting, "wall wash" lighting, emergency egress lighting, as well as illumination of an object or person in a region or area intended to be occupied by one or more people. A task lighting application, for example, typically requires a minimum of approximately 20 footcandles (fcd) on the surface or level at which the task is to be performed, e.g. on a desktop or countertop. In a room, where the light fixture is mounted in or hung from the ceiling or wall and oriented as a downlight, for example, the distance to the task surface or level can be 35 inches or more below the output of the light fixture. At that level, the light intensity will still be 20 fcd or higher for task lighting to be effective. Of course, the fixtures of FIGS. 3A, 3B, may be used in other applications, such as vehicle headlamps, flashlights, etc.

A plurality of stacked lightguide elements is contemplated. It may be practical to select and choose two, three or more such phosphors for deployment in the various lightguide elements in a manner that produces a particular desired spectral characteristic in the combined light output generated by the phosphor emissions, which may then be tuned or adjusted by controlling the drive of the solid state sources and thus the levels of the respective amounts of excitation light of the various phosphors from the different lightguide elements in the visible light output of the fixture or system.

Figure 3A:
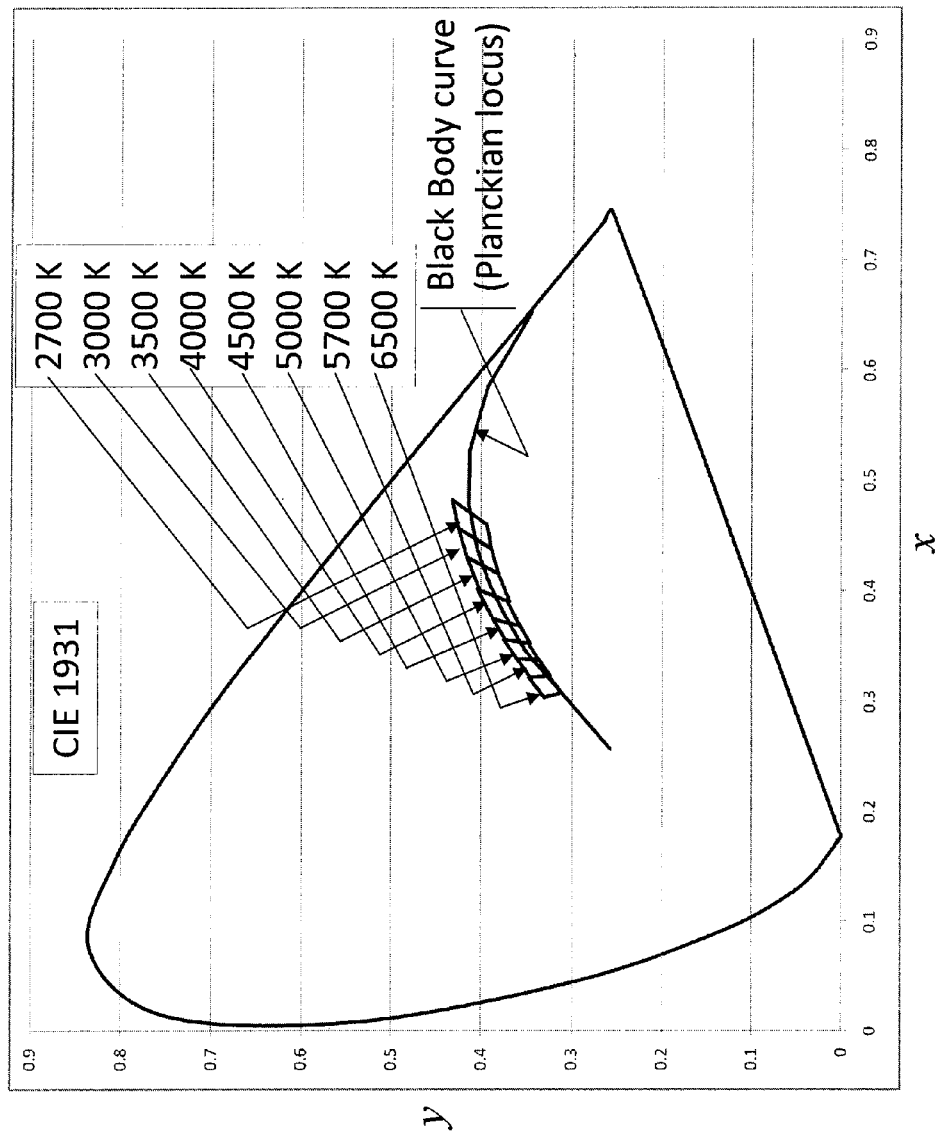
FIG. 3A is a color chart showing the black body curve and tolerance quadrangles along that curve for chromaticities corresponding to a number of color temperature ranges that are desirable in many general lighting applications.
Figure 3B:
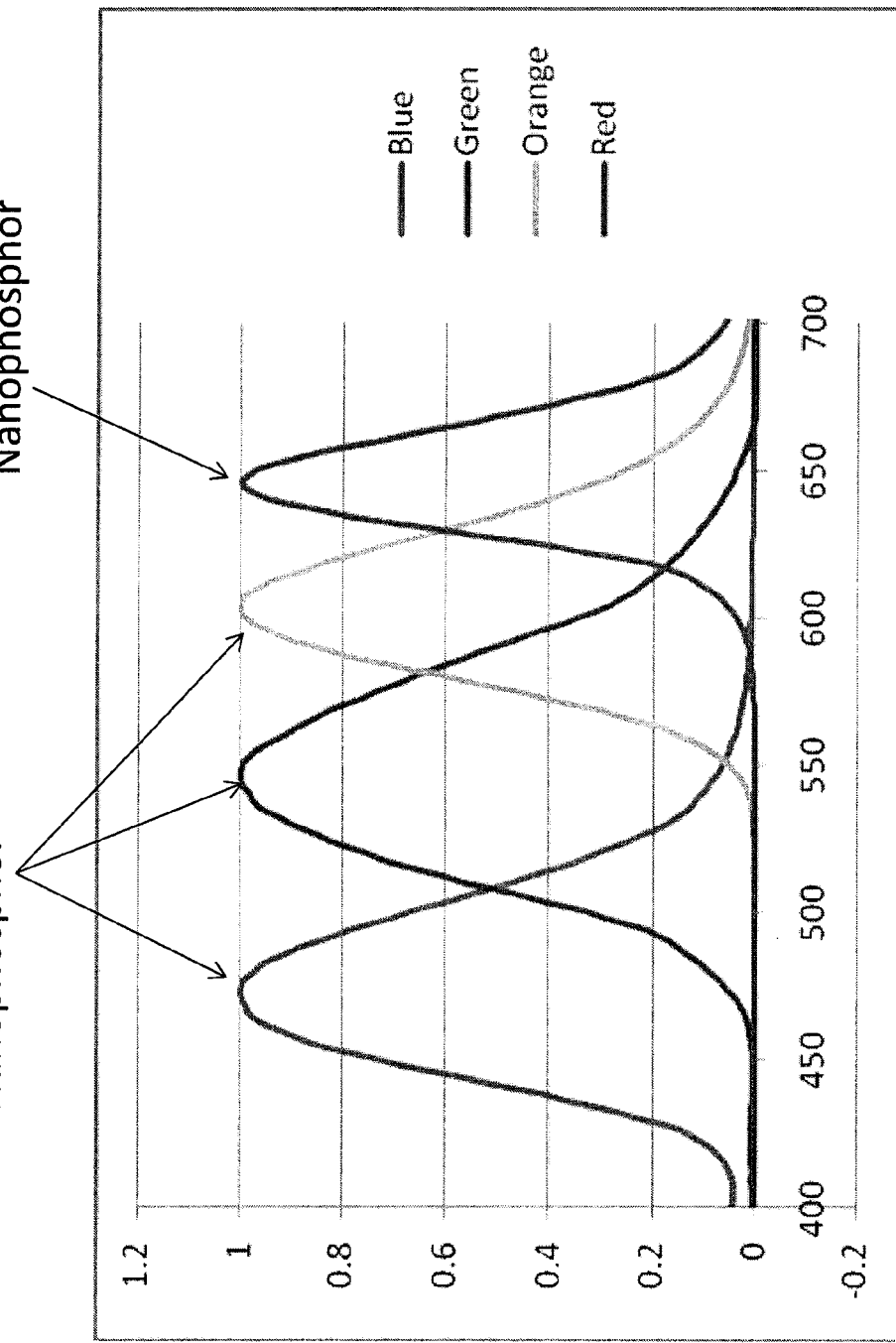
FIG. 3B is a radiation spectral graph, showing the different emission of four phosphors used in several of the examples.

Macro scale reflector 35 (outside the packaging of source 31) defines the optical volume 37. Lightguide element 32a fills some or all of the optical volume 37. Light guide element 32a includes a containment vessel/chamber 34a, 34b for the phosphor bearing solid, gas or liquid. The reflector 35 has a reflective surface arranged along an exterior perimeter of the optical volume 37 to receive at least some electromagnetic energy from the solid state sources 31 and/or a remote phosphor material 34c contained in containment vessel/chamber 34a or 34b. The disclosed fixture examples 30a, 30b may use a variety of different structures or arrangements for the reflector 35. In addition, reflector 35a shown in FIGS. 3A, 3B is positioned between solid state sources 31 and optical aperture 33 to receive at least some electromagnetic energy from the solid state sources 31 and/or remote phosphor material 34c contained in vessel/chamber 34a, 34b. Reflector 35a also serves as a mask to block direct view of the solid state sources from a person in the area of aperture 33. For efficiency, the reflective surface of the reflectors 35, 35a facing into the cavity 37 should be highly reflective. The reflective surface may be specular, semi or quasi specular, or diffusely reflective. The lightguide configuration in FIGS. 2A and 2B has four acute angled corners.

For lightguide purposes, a cladding 32 (as well as the cladding layer illustrated in FIGS. 4 and 5) is one or more layers of material, preferably on the outside surface(s) of the lightguide 32a. The cladding layer 32 has a lower refractive index, whereas the material of the lightguide has a higher refractive index. Because of the difference in refractive index, the cladding 32 is reflective and tends to reflect light impacting the cladding/lightguide at shallow angles back within the optical cavity. In this way, the lightguide 32a exhibits total internal reflection at the boundary interface between the lightguide element and the cladding, at least with respect to light reaching that interface at a relatively shallow angle. Light directly emitted from the source(s) 31 would hit the cladding 32 at a shallow angle so as to reflect and stay confined within the lightguide. Light reaching the cladding 32 at steeper angles, including substantial amounts of light emitted by the excited phosphor(s) in the chamber 34a, is not subject to the total internal reflection and therefore passes through the outer surface of the lightguide and the cladding.

In the examples of FIGS. 2A and 2B, the lightguide 32a is round shaped and substantially fills the optical volume 37. Those skilled in the art will recognize that the lightguide 32a may be made of a variety of materials/structures having the desired optical properties. For example, lightguide 32a could be made from a 3M™ Light Pipe, which is filled with a phosphor bearing material in the chamber and appropriately sealed. The lightguide can have a reflective coating and a transmissive section adjacent to the solid state sources. As manufactured by 3M™, a Light Pipe is a transparent tube lined with 3M™ Optical Lighting Film, which is a micro-replicated prismatic film. The film is transmissive with respect to light striking the surface of the film at steep angles, but it is highly reflective to light striking the surface of the film at shallow angles. In a lightguide 32a implemented using the 3M™ a Light Pipe, light emitted by the solid state sources 31 which strikes the film reflects back into the interior of the lightguide and tends to travel along the length of the lightguide 32a. If not absorbed by a phosphor particle in the chamber 32a contained within the lightguide 12, the light may reflect back from the reflector 35, 35a and travel the length of the lightguide again, with one or more reflections off the film lining the interior surface of the lightguide. However, light generated by phosphor excitations within the lightguide 32a impacts the film at steeper angles, and the film allows relatively uniform release along the length of the lightguide 32a.

Figure 4:
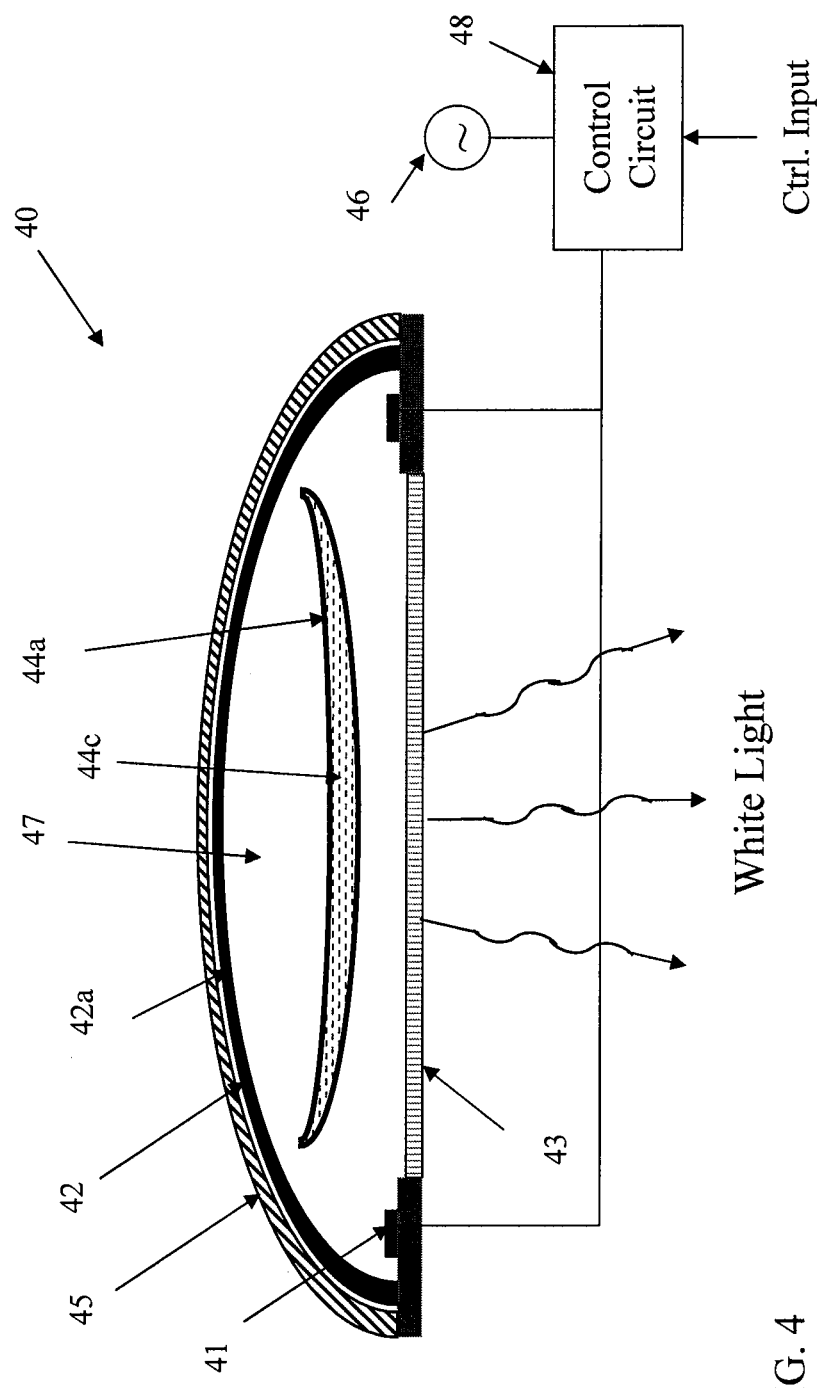
FIG. 4 illustrates another example of a white light emitting fixture, similar to that of FIGS. 2A and 2B, but using a different configuration for the chamber and positioning of the solid state sources.

In the example, the emitting regions of the solid state sources 31 are optically coupled to the lightguide 32a. The solid state sources 31 may be coupled to the lightguide 32a in any manner that is convenient and/or facilitates a particular lighting application of the fixtures 30a or 30b. For example, as shown in FIG. 4, the solid state sources 41 are alternatively positioned around optical aperture 43, facing reflector 45 positioned in the lightguide 42a to emit electromagnetic energy into the interior of the lightguide 42a.

The lightguide 32a, in FIGS. 2A and 2B, will include or have associated therewith remote phosphor(s) 34c contained in containment vessel/chamber 34a or 34b. The phosphor(s) 34c are located apart from the semiconductor chip of the source(s) 31 used in examples 30a, 30b. In lighting fixture examples 30a and 30b, the containment vessel/chambers 34a and 34*b* including a light transmissive material such as a gas, liquid or solid, which contains phosphors 34*c* dispersed therein. The containment vessel/chamber 34*a* can be fastened to one or more walls of the lightguide by way of a fastening plate (not shown) in an otherwise hollow optical volume 37 or alternatively, the containment vessel/chamber 34*a* is positioned within a solid optical volume 37 having hollow portion that is filled with a gas, liquid or solid.

In FIG. 3A, the phosphors 34*c* are dispersed in a liquid medium and contained within containment vessel/chamber 34*a*. In FIG. 3B, the phosphors 34*c* are dispersed in a gas or solid medium and contained within containment vessel/chamber 34*b*. The medium (gas, liquid or solid) preferably exhibits high transmissivity and/or low absorption to light of the relevant wavelengths, although it may be transparent or somewhat translucent. Although alcohol, oils (synthetic, vegetable or other oils) or other media may be used, in the example of FIG. 3A, the medium may be a silicon material. If silicone is used, it may be in gel form. The material defining or forming the containment vessel/chamber 34*a*, 34*b*, when containing a liquid or gas, also may exhibit high transmissivity and/or low absorption to light of the relevant wavelengths.

When the containment vessel/chamber 34*a*, 34*b* contains a gas or liquid, it may be smooth and highly transparent or translucent, and/or one or more surfaces may have an etched or roughened texture. If hardened silicon or other solid is used as a solid medium, the optical volume surrounding the solid medium may be solid as well, but includes a hollow portion for containing the phosphor bearing (solid) material. If a gas is used as the phosphor bearing material, the gaseous material, for example, may be hydrogen gas, any of the inert gases, and possibly some hydrocarbon based gases. Combinations of one or more such types of gases might be used.

Semiconductor nanophosphors are often produced in solution. Near the final production stage, the semiconductor nanophosphors are contained in a liquid solvent. However, the solvents tend to be rather volatile/flammable, and other liquids such as water or vegetable oil may be used. The semiconductor nanophosphors may be contained in a dissolved state in solution, or the liquid and semiconductor nanophosphors may form an emulsion. The liquid itself may be transparent, or the liquid may have a scattering or diffusing effect of its own (caused by an additional scattering agent in the liquid or by the translucent nature of the particular liquid).

The phosphor bearing material is transmissive and has one or more properties that are wavelength independent. A clear material used to bear the phosphors would have a low absorptivity with little or no variation relative to wavelengths, at least over most if not all of the visible portion of the spectrum. If the material is translucent, its scattering effect due to refraction and/or reflection will have little or no variation as a function of wavelength over at least a substantial portion of the visible light spectrum.

In FIG. 3A, where the bearer material for the phosphors is liquid, a bubble (not shown) may be created when the containment vessel/chamber 34*a* is filled, and the bubble is accommodated at the curved ends of containment vessel/chamber 34*a*. The slight curvature allows for any bubble(s) to collect near the ends of the optical element such that the bubbles(s) do not interfere with phosphor excitation and may not be readily visible through the aperture 33. If present, the bubble may be either a gas-filled bubble or a vacuum-vapor bubble. Of course, the upper portion of the vessel for bubble capture may be at other locations.

If the bubble contains a deliberately provided gas, that gas should not contain oxygen or any other element that might interact with the phosphors. Nitrogen would be one appropriate example of a gas that may be used.

If the bubble is a vacuum-vapor bubble, the bubble is formed by drawing a vacuum, for example, due to the properties of the suspension or environmental reasons. If a gas is not deliberately provided, vapors from the liquid will almost certainly be present within the vacuum, whenever conditions would create some vacuum pressure within the container. For example, the vacuum-vapor bubble might form due to a vacuum caused by a differential between a volume of the liquid that is less than the volume of the interior of the container. This might occur for example due to a low temperature of the liquid, for example, if the liquid is placed in the container while hot and allowed to cool or if the liquid is of such an amount as to precisely fill the container at a designated operating temperature but the actual temperature is below the operating temperature. Any vapor present would be caused by conversion of the liquid to a gas under the reduced pressure.

In either case, the gas bubble or the vacuum-vapor bubble can be sized to essentially disappear when the suspension material reaches its nominal operating temperature, with sizing such that the maximum operating pressure is not exceeded at maximum operating temperature. If it is a gas-filled bubble, it will get smaller, but will probably not completely disappear with increased temperature, but will at least lodge itself in the curved endings of the containment vessel/chamber 34*a*. A preferred embodiment is a vacuum-vapor bubble, which may disappear completely at appropriate temperatures.

When the fixture is turned on, the solid state sources 31 will emit light and enter into the light guide 32*a*. Some of the light from the solid state sources will penetrate the containment vessel/chamber 34*a* and excite the phosphors contained therein. Phosphor emissions from the containment vessel/chamber 34*a* are integrated by diffuse reflection, by way of macro reflector 35, in the optical volume 37. Thus, light outputted from the fixture via the aperture 33 is highly integrated light. the highly integrated light is substantially white light.

As outlined above, the phosphors 34*c* are of types excitable by energy from the solid state sources 31. Together, the excited phosphors produce output light that is at least substantially white and has a color rendering index (CRI) of 75 or higher. In certain examples, the fixture output light produced by this near UV excitation of the phosphors, such as semiconductor nanophosphors, exhibits color temperature in one of the desired ranges along the black body curve discussed below. In more specific examples, the phosphors are doped semiconductor nanophosphors. Different light fixtures or systems designed for different color temperatures of white output light would use different formulations of mixtures of doped semiconductor nanophosphors. The phosphors dispersed in the transmissive material are of types or configurations (e.g. selected types of semiconductor nanophosphors and/or doped semiconductor nanophosphors) excitable by the relevant emission spectrum of energy from the solid state source 11. In the illustrated example, the phosphors may have absorption spectra that include some or all of the near UV range, in particular the 405 nm emission spectrum of the exemplary LED source 11. Stated another way, the absorption spectrum of each phosphor encompasses at least a substantial portion and sometimes all of the emission spectrum of the LED type solid state source. When excited by electromagnetic energy in its absorption spectrum from the solid state source, each phosphor emits visible light in a characteristic emission spectrum. Where the phosphor is a semiconductor nanophosphor, particularly a doped semiconductor nanophosphor, the phosphor emission spectrum may be separated from the absorption spectrum of the phosphor. The lighting device is configured so that a visible light output of the lighting device for the intended lighting application contains a combination of light of all of the emission spectra from the phosphors, when the remote phosphors together are excited by electromagnetic energy of the emission spectrum from the solid state source. Stated another way, excited phosphor emissions from each phosphor in the transmissive material will be included in a light output for the fixture.

The lighting fixtures, lamps or other light emitting devices utilize two, three, four or more phosphors excited so that the light output exhibits desired characteristics, particularly a color temperature within a tolerance or range for the rated temperature of the device and approaching or approximating a section of the black body radiation spectrum for the rated color temperature. We will discuss aspects of the phosphor light generation and attendant device output characteristics before discussing specific examples of appropriate phosphors.

For purposes of discussion of light emission or generation and associated color or spectral characteristics of the light, a "black body" is a theoretically ideal body that emits or radiates a continuous spectrum of light, where the radiation spectrum varies as a function of the temperature of the black body. When cold, the body does not reflect or transmit light and therefore would appear "black." However, at a particular temperature, it emits a characteristic broad continuous spectrum. There is a range of temperatures for the black body where the body would produce visible light exhibiting spectral characteristics humans consider to be visible white light. These points correspond to a range along the "black body" curve (termed the Planckian locus) on the CIE color chart. Because of the broad continuous spectral output of the black body, white light corresponding to such points on the on the black body curve provides high quality spectral content, which humans tend to perceive as "natural light." Hence, a lighting device outputting white light of a spectrum the same as or similar to a black body radiation spectrum would provide a high quality spectral content desirable for many lighting applications.

A number of color temperatures are particularly useful in common general lighting applications. For a perfect black body source, the color of the light output would fall on the black body curve (Planckian locus) on the CIE color chart. However, practical lighting devices may not be ideal, and ranges around points on the black body curve (Planckian locus) on the CIE color chart produce commercially acceptable results, e.g. for many general lighting applications.

In a white light type example of the fixture 30a or 30b (FIGS. 2A and 2B) for example, the excited phosphors together enable the light emitting fixture to produce output light that is at least substantially white and has a high quality spectral content, e.g. corresponding to a high color rendering index (CRI) (e.g. of 75 or higher). The output light produced during this excitation of the semiconductor nanophosphors exhibits color temperature in one of several desired ranges along the black body curve in the visible color space, for example, on the CIE color chart. Examples discussed below use mixtures containing a plurality of different phosphors. Different light fixtures, lamps or other light emitting devices designed for different color temperatures of white output light would use different formulations or mixtures of the phosphors. Alternatively, different light fixtures, lamps or other light emitting devices designed for different color temperatures of white output light may use one or more different or additional phosphors in the mix.

Examples of the white output light of the fixture 30a or 30b, for example, may exhibit color temperature in one of the specific ranges along the black body curve listed in Table 1 below.

| Nominal Color Temp. (° Kelvin) | Color Temp. Range (° Kelvin) |
|---|---|
| 2700 | 2725 ± 145 |
| 3000 | 3045 ± 175 |
| 3500 | 3465 ± 245 |
| 4000 | 3985 ± 275 |
| 4500 | 4503 ± 243 |
| 5000 | 5028 ± 283 |
| 5700 | 5665 ± 355 |
| 6500 | 6530 ± 510 |

Table 1—Nominal Color Temperatures and Corresponding Color Temperature Ranges

In Table 1, each nominal color temperature value represents the rated or advertised temperature as would apply to particular fixture or lamp products having an output color temperature within the corresponding range. The color temperature ranges fall along the black body curve (Planckian locus). FIG. 3A shows the outline of the CIE 1931 color chart, and the curve across a portion of the chart represents a section of the black body curve that includes the desired CIE color temperature (CCT) ranges. The light may also vary somewhat in terms of chromaticity from the color coordinates of points on the black body curve. The quadrangles shown in the drawing represent the respective ranges of chromaticity for the nominal CCT values. Each quadrangle is defined by the range of CCT and the distance from the black body curve. Table 2 (in parts 2A and 2B) below provides chromaticity specifications for the eight exemplary color temperature ranges. The x, y coordinates define the center points on the black body curve and the vertices of the tolerance quadrangles diagrammatically illustrated in the color chart of FIG. 3A.

Of note, 5400° Kelvin corresponds to an accepted color temperature range for sunlight in the daytime, and that color temperature is within the 5700 range. For example, a light emitting device (e.g. light fixture, lamp, LED or the like) rated advertised at 5400° Kelvin may be of some commercial interest as it corresponds to the solar daylight spectrum, e.g. as might be desirable for a 'day light' product.

TABLE 2A

Chromaticity Specification for Nominal Values/CCT Ranges
(for rated/nominal CCTs of 2700° K to 4000° K)

| | CCT Range | | | | | | | |
|---|---|---|---|---|---|---|---|---|
| | 2725 ± 145 | | 3045 ± 175 | | 3465 ± 245 | | 3985 ± 275 | |
| | | | | Nominal CCT | | | | |
| | 2700° K | | 3000° K | | 3500° K | | 4000° K | |
| | x | y | x | y | x | y | x | y |
| Center point | 0.4578 | 0.4101 | 0.4338 | 0.4030 | 0.4073 | 0.3917 | 0.3818 | 0.3797 |
| | 0.4813 | 0.4319 | 0.4562 | 0.4260 | 0.4299 | 0.4165 | 0.4006 | 0.4044 |
| Tolerance | 0.4562 | 0.4260 | 0.4299 | 0.4165 | 0.3996 | 0.4015 | 0.3736 | 0.3874 |
| Quadrangle | 0.4373 | 0.3893 | 0.4147 | 0.3814 | 0.3889 | 0.3690 | 0.3670 | 0.3578 |
| | 0.4593 | 0.3944 | 0.4373 | 0.3893 | 0.4147 | 0.3814 | 0.3898 | 0.3716 |

TABLE 2B

Chromaticity Specification for Nominal Values/CCT Ranges
(for rated/nominal CCTs of 4500° K to 6500° K)

| | CCT Range | | | | | | | |
|---|---|---|---|---|---|---|---|---|
| | 4503 ± 243 | | 5028 ± 283 | | 5665 ± 355 | | 6530 ± 510 | |
| | | | | Nominal CCT | | | | |
| | 4500° K | | 5000° K | | 5700° K | | 6500° K | |
| | x | y | x | y | x | y | x | y |
| Center point | 0.3611 | 0.3658 | 0.3447 | 0.3553 | 0.3287 | 0.3417 | 0.3123 | 0.3282 |
| | 0.3736 | 0.3874 | 0.3551 | 0.3760 | 0.3376 | 0.3616 | 0.3205 | 0.3481 |
| Tolerance | 0.3548 | 0.3736 | 0.3376 | 0.3616 | 0.3207 | 0.3462 | 0.3028 | 0.3304 |
| Quadrangle | 0.3512 | 0.3465 | 0.3366 | 0.3369 | 0.3222 | 0.3243 | 0.3068 | 0.3113 |
| | 0.3670 | 0.3578 | 0.3515 | 0.3487 | 0.3366 | 0.3369 | 0.3221 | 0.3261 |

The lighting fixtures described herein could use a variety of different combinations of phosphors to produce any output within a selected one of the CCT and chromaticity ranges of Tables 1 and 2. Mixtures of types of semiconductor nanophosphors to produce such outputs are discussed more, by way of examples, later. The phosphors are selected and combined in amounts that cause the output of the lighting device to exhibit the desired characteristics, in this case, including close correspondence to or approximation of a section of the black body radiation spectrum for the rated color temperature.

As outlined earlier, the radiation spectrum of a black body at a particular white light color temperature may be considered a theoretical ideal for natural lighting, at least for many white lighting applications. For example, a black body radiation spectrum produces a perfect 100 CRI value, for a given color temperature. An ideal light source for an application requiring a particular color temperature of white light therefore might provide a radiation spectrum conforming to the black body radiation spectrum for that color temperature and therefore would exhibit a perfect CRI score. Hence, it would be desirable for a solid state light emitting device to provide a color temperature output in a selected one of the ranges and chromaticity quadrangles listed in the tables above, and for the selected temperature range, to provide a radiation spectrum in the output that approaches or approximates the black body radiation spectrum for the nominal or rated color temperature over at least a substantial section of the humanly visible portion of the electromagnetic spectrum.

The CIE color rendering index or "CRI" is a standardized measure of the ability of a light source to reproduce the colors of various objects, based on illumination of standard color targets by a source under test for comparison to illumination of such targets by a reference source. CRI, for example, is currently used as a metric to measure the color quality of white light sources for general lighting applications. Presently, CRI is the only accepted metric for assessing the color rendering performance of light sources. However, it has been recognized that the CRI has drawbacks that limit usefulness in assessing the color quality of light sources, particularly for LED based lighting products. NIST has recently been working on a Color Quality Scale (CQS) as an improved standardized metric for rating the ability of a light source to reproduce the colors of various objects. The spectral quality of the white light produced by black bodies and by the systems discussed herein is discussed in terms of CRI, as that is the currently available/accepted metric. Those skilled in the art will recognize, however, that the systems may be rated in future by corresponding high measures of the quality of the white light outputs using appropriate values on the CQS once that scale is accepted as an appropriate industry standard. Of course, other even more accurate metrics for white light quality measurement may be developed in future.

At least for the relevant color temperatures, the radiation spectrum of a black body encompasses the humanly visible portion of the electromagnetic spectrum, but it also encompasses more of the electromagnetic spectrum. Even within the humanly visible portion of the electromagnetic spectrum, regions in the middle of the spectrum are more important for commercial lighting applications than portions approaching the extremes of the humanly visible portion of the electromagnetic spectrum.

An ideal such as a black body radiation spectrum is likely difficult and/or expensive to achieve in a commercial solid state lighting product. LED manufacturers today offer LEDs rated to provide a CRI of 75 or higher. The intent here is to provide high spectral light approaching a black body radiation spectrum over at least a particular range of the visible spectrum. Hence, an analysis was performed on data for black body radiation spectra for the various color temperatures of interest to identify the portion of each black body radiation spectrum that produced a CRI of 75 or above.

An output spectrum of an actual lighting device will not and typically need not extend as far toward or beyond the edges of the humanly visible portion of the electromagnetic spectrum. The humanly visible portion of the electromagnetic spectrum is centered around 555 nm. It is possible to consider spectral quality, such as CRI, over a portion of the visible spectrum including a portion centered around 555 nm, to determine the wavelength range in which a truncated black body radiation spectrum would still provide the desired spectral performance, that is to say a CRI at or above 85 in one example.

Hence, as a metric of performance, it would be useful for a light emitting device to produce an output spectrum that approaches or approximates the black body radiation spectrum for the rated color temperature of the device, over that portion of the visible spectrum in which the black body radiation spectrum exhibits CRI of 85 or higher. CRI analysis was performed on data regarding black body radiation spectra for the exemplary nominal or rated color temperatures discussed above, over a number of wavelength ranges centered around 555 nm. From this analysis, it was found that a range of 210 nm of the visible light portion of the black body spectrum for each rated color temperature, such as the 450-660 nm (centered around 555 nm), resulted in CRI of a CRI at or above 85, for the color nominal or rated temperatures under consideration herein. Specific CRI results, for the 210 nm section of the black body radiation spectrum from 450 to 660 nm (truncated), are shown in Table 3 below.

| Nominal Color Temp. (° Kelvin) | CRI for BB Spectrum 450-660 nm |
| --- | --- |
| 2700 | 92 |
| 3000 | 92 |
| 3500 | 90 |
| 4000 | 89 |
| 4500 | 87 |
| 5000 | 86 |
| 5700 | 85 |
| 6500 | 85 |

Table 3—CRI Results, for a 450-660 nm Portion of the Respective Black Radiation Spectrum at Nominal Color Temperatures As shown in the table, for the selected color temperatures in the range of 2700 to 6500° Kelvin, the 450-660 nm portion of the respective black body radiation spectrum produces a CRI of 85 or higher. Based on this analysis of black body radiation spectra and associated CRI, it was determined that a desirable performance target for a high spectral quality solid state light emitting device output would be to approach or approximate a black body radiation spectrum for the rated color temperature for the device, over at least 210 nm of the visible light portion of the black body radiation spectrum for the rated color temperature, e.g. over the 450-660 nm range (centered around 555 nm).

The light emitting devices under consideration here may use a variety of different types of phosphors. However, it may be helpful to consider specific examples of phosphors that are believed to be suitable for producing a high spectral quality solid state light output that approaches or approximates a black body radiation spectrum for the rated color temperature for the device over the 210 nm bandwidth of the visible light spectrum.

Semiconductor nanophosphors are nanoscale crystals or "nanocrystals" formed of semiconductor materials, which exhibit phosphorescent light emission in response to excitation by electromagnetic energy of an appropriate input spectrum (excitation or absorption spectrum). Examples of such nanophosphors include quantum dots (q-dots) formed of semiconductor materials. Like other phosphors, quantum dots and other semiconductor nanophosphors absorb light of one wavelength band or spectrum and re-emit light at a different band of wavelengths or different spectrum. However, unlike conventional phosphors, optical properties of the semiconductor nanophosphors can be more easily tailored, for example, as a function of the size of the nanocrystals. In this way, for example, it is possible to adjust the absorption spectrum and/or the emission spectrum of a semiconductor nanophosphor by controlling crystal formation during the manufacturing process so as to change the size of the nanocrystals. For example, nanocrystals of the same material, but with different sizes, can absorb and/or emit light of different colors. For at least some semiconductor nanophosphor materials, the larger the nanocrystals, the redder the spectrum of re-emitted light; whereas smaller nanocrystals produce a bluer spectrum of re-emitted light. Doped semiconductor nanophosphors are somewhat similar in that they are nanocrystals formed of semiconductor materials. However, this later type of semiconductor nanophosphors is doped, for example, with a transition metal or a rare earth metal. The examples discussed more specifically below utilize mixtures of semiconductor nanophosphors. The mixtures may use only three or more doped semiconductor nanophosphors, or three or more non-doped semiconductor nanophosphors. In several specific examples, the mixtures use four semiconductor nanophosphors, in which three of the phosphors are doped semiconductor nanophosphors and one is a non-doped semiconductor nanophosphor.

Semiconductor nanophosphors, including doped semiconductor nanophosphors, may be grown by a number of techniques. For example, colloidal nanocrystals are solution-grown, although non-colloidal techniques are possible.

For a high spectral content quality type of white light application, a material containing or otherwise including a dispersion of semiconductor nanophosphors, of the type discussed in the examples herein, would contain two, three or more different types of semiconductor nanocrystals sized and/or doped so as to be excited by the light energy in the relevant part of the spectrum. In several examples, absorption spectra have upper limits somewhere between 430 and 460 nm (nanometers), and the light emitting devices use one or more LEDs rated to emit light in a comparable portion of the spectrum. The different types of nanocrystals (e.g. semiconductor material, crystal size and/or doping properties) in the mixture are selected by their emission spectra, so that together the excited nanophosphors provide light output for the device that has the spectral quality of white light for a rated color temperature, meeting the spectral quality parameters discussed herein, when all are excited by the energy from the relevant type of solid state source.

Doped semiconductor nanophosphors exhibit a relatively large Stokes shift, from lower wavelength of absorption spectra to higher wavelength emissions spectra. In several specific examples, each of the doped semiconductor nanophosphors is of a type excited in response to near UV electromagnetic energy in the range of 380-420 nm and/or UV energy in a range of 380 nm and below. Each type of nanophosphor re-emits visible light of a different spectral characteristic. At least for the doped semiconductor nanophosphors, each phosphor emission spectra has little or no overlap with excitation or absorption ranges of the doped semiconductor nanophosphors dispersed in the material. Because of the magnitudes of the shifts, these emissions are substantially free of any overlap with the absorption spectra of the phosphors, and re-absorption of light emitted by the doped semiconductor nanophosphors can be reduced or eliminated, even in applications that use a mixture of a number of such phosphors to stack the emission spectra thereof so as to provide a desired spectral characteristic in the combined light output.

The nanophosphors used in the devices discussed herein are excited by light in the near UV to blue end of the visible spectrum and/or by UV light energy. However, nanophosphors can be used that are relatively insensitive to other ranges of visible light often found in natural or other ambient white visible light. Hence, when the lighting device is off, the semiconductor nanophosphors will exhibit little or not light emissions that might otherwise be perceived as color by a human observer. The medium or material chosen to bear the nanophosphors is itself at least substantially color-neutral (e.g. transparent or translucent). Although not emitting, the particles of the semiconductor nanophosphors may have some color, but due to their small size and dispersion in the material, the overall effect is that the material with the nanophosphors dispersed therein appears at least substantially color-neutral to the human observer, that is to say it has little or no perceptible tint, when there is no excitation energy from the appropriate solid state source.

For purposes of further discussion, we will assume that the phosphors in the light emitting device include three doped semiconductor nanophosphors, for emitting blue, green and orange light. Examples of suitable doped semiconductor nanophosphor materials for the blue, green and orange phosphors are available from NN Labs of Fayetteville, Ark. In a specific example, one or more of these doped semiconductor nanophosphors comprise zinc selenide quantum dots doped with manganese or copper. A fourth phosphor is a red emitting phosphor. The fourth phosphor could be a conventional phosphor or another doped semiconductor nanophosphor, but in the examples, the fourth phosphor is a non-doped semiconductor nanophosphor.

FIG. 3B is a radiation spectrum graph showing a wavelength range in the visible spectrum from 400 nm to 700 nm. The four curves shown on that graph represent the four different emission spectra of the exemplary blue, green, orange and red semiconductor nanophosphors used in the more specific examples. The graph of FIG. 3B shows the phosphor emissions as having the same output intensity level, e.g. in a fashion normalized with respect to intensity.

In FIG. 3B, the leftmost curve represents the blue phosphor emissions. The blue phosphor is a doped semiconductor type nanophosphor. Although not shown, the absorption spectrum for this phosphor will include the 380-420 nm near UV range and extend into the UV range, but that absorption spectrum drops substantially to 0 (has an upper limit) about 450 or 460 nm. This phosphor exhibits a large Stokes shift from the short wavelength(s) of absorbed light to the longer wavelengths of re-emitted light. The emission spectrum of this blue phosphor has a broad peak in the wavelength region humans perceive as blue, e.g. centered around a wavelength approximately in the range of 470 to 475 nm in the illustrated example. The main peak of the emission spectrum of the phosphor is well above the absorption spectra of the various other semiconductor nanophosphors and well above its own absorption spectrum, although in the case of the blue example, there may be just a small amount of emissions in the region of the phosphor absorption spectra. As a result, blue emissions from this doped semiconductor nanophosphor would re-excite that phosphor at most a minimal amount. The absorption spectrum at or below 460 nm would be below the emission spectrum of the other three phosphors. Hence, the blue phosphor emissions would be subject to relatively little phosphor re-absorption, even in mixtures containing the other semiconductor nanophosphors. As shown, however, the blue phosphor provides a relatively broad radiation spectrum, as might appear as a pastel blue to a human observer.

In FIG. 3B, the next curve represents the green phosphor emissions. The orange phosphor is another doped semiconductor nanophosphor. The absorption spectrum for this phosphor includes the 380-420 nm near UV range and extends down into the UV range, but that absorption spectrum drops substantially to 0 (has an upper limit) somewhere around or a bit below 450 nm. As noted, the phosphor exhibits a large Stokes shift from the short wavelength(s) of absorbed light to the longer wavelengths of re-emitted light. The emission spectrum of this green phosphor has a fairly broad peak in the wavelength region humans perceive as green, e.g. centered around approximately 550 nm in the illustrated example. Again, the emission spectrum of this phosphor is well above the absorption spectra of the other doped semiconductor nanophosphors and well above its own absorption spectrum. The absorption spectrum at or below 460 nm would be below the emission spectrum of the other three phosphors, except possibly for some small overlap with the blue emission spectrum. As a result, green emissions from the second doped semiconductor nanophosphor would not re-excite that phosphor and would not substantially excite the other semiconductor nanophosphors if mixed together. Stated another way, the green phosphor emissions would be subject to little or no phosphor re-absorption, even in mixtures containing the other doped semiconductor nanophosphors. As shown, however, the green phosphor provides a relatively broad radiation spectrum, as might appear as a pastel green to a human observer.

The third line of the graph shows the emission spectrum for an orange emitting doped semiconductor nanophosphor. Although not shown, the absorption spectrum for this third phosphor also includes the 380-420 nm near UV range and extends down into the UV range, but that absorption spectrum drops substantially to 0 (has an upper limit) about 450 or 460 nm. This phosphor also exhibits a large Stokes shift from the short wavelength(s) of absorbed light to the longer wavelengths of re-emitted light. The emission spectrum of this phosphor has a broad peak in the wavelength region humans perceive as orange, e.g. centered around a wavelength in a range of say 600-610 nm in the illustrated example. Again, the emission spectrum of the phosphor is well above the illustrated absorption spectra of the other doped semiconductor nanophosphors and well above its own absorption spectrum. The absorption spectrum at or below 460 nm would be below the emission spectrum of the other three phosphors, except possibly for some small overlap with the blue emission spectrum. As a result, orange emissions from the third doped semiconductor nanophosphor would not substantially re-excite that phosphor and would not substantially excite the other semiconductor nanophosphors if mixed together. Stated another way, the orange phosphor emissions also should be subject to little or no phosphor re-absorption, even in mixtures containing the other semiconductor nanophosphors. As shown, however, the orange phosphor provides a relatively broad radiation spectrum, as might appear as a pastel orange to a human observer.

To increase the emissions of the device at the higher wavelength range of the 210 nm wide portion of the visible spectrum, the mixture used further includes a red emitting phosphor. Although doped semiconductor nanophosphors could be used, this example, assumes that the red phosphor is a cadmium based semiconductor nanophosphor (non-doped). Although not shown, the absorption spectrum for this fourth phosphor also includes the 380-420 nm near UV range. Depending on the phosphor used, the absorption spectrum may extend down into the UV range or may extend somewhat up into the blue range. In the later case, the red phosphor may be somewhat subject to more re-absorption of and excitation in response to emissions from the other phosphors, than was the case for the doped semiconductor nanophosphors. The emission spectrum of this fourth phosphor has a broad peak in the wavelength region humans perceive as red, e.g. centered approximately around 650 nm in the illustrated example.

Hence, in a light fixture of the type under consideration here, each phosphor will have a characteristic emission spectra, such as the four different spectra shown in FIG. 3B. Light is additive, and a light emitting device of the type discussed here will combine light from multiple phosphors to produce its light output. Hence, the light output contains a combination of light of all of the emission spectra from the phosphors, when the remote phosphors together are excited by electromagnetic energy of the emission spectrum of the solid state source. The contribution of each individual phosphor emission spectrum to the combined spectrum in the device output depends on the amount of emissions by the particular type of phosphor. Assuming that sensitivity and amount of pumping is sufficient to fully excite all of the different phosphors in the mixture, the contribution of a particular phosphor will depend on the proportional amount of that phosphor in the mixture. The combined spectrum of the device output therefore is dependent on the relative amounts of the various phosphors used in the mixture.

The light emitting device may be configured to allow some emission from the solid state source in the device output. In such a case, the phosphors do not absorb all of the emissions in the source emission range. In the specific examples, however, we will assume that the total concentration of phosphors in the mixture are sufficient to fully absorb all of the emission of electromagnetic energy from the solid state source.

As noted, variation in the proportions or percentages of different phosphors with respect to the total amount of phosphors in the mix adapts a particular light emitting device design to output different color temperatures of white light. As discussed later, an appropriate mixture of the phosphors for a selected one of the color temperatures will also result in device outputs within certain tolerance metrics with respect to the 210 nm wide section of the black body radiation spectrum for the particular nominal color temperature. Using spectral data for the relevant phosphor materials, corresponding to the respective spectra shown in FIG. 3B, approximate percentage mixtures were developed as would be expected to produce outputs of the color characteristics at the specified nominal color temperatures. Table 4 below shows relative percentages of four phosphors (blue, green and orange doped semiconductor nanophosphors; and a red semiconductor nanophosphor) that may be used in exemplary fixtures, where the spectral data for the phosphors show that the combinations should produce a device output having the rated or nominal color temperature. The colors of the phosphors represent the general appearance of the color emitted by each phosphor. As outlined above, however, these phosphors provide relatively broad emission spectra and may appear somewhat pastel in color (rather than more pure or saturated hues). For each phosphor, the percentage is the proportional amount of that phosphor with respect to the total amount of phosphors in the mixture (combination of all four phosphors in the example). As discussed more later, these percentage mixtures of the phosphors also cause light emitting devices using such mixtures to produce light that approaches or approximates the black body radiation spectrum for the rated color temperatures.

TABLE 4

Percentages of Phosphors in Mixtures for Selected Color Temperature Ranges

| Nominal CCT | % Blue | % Green | % Orange | % Red |
|---|---|---|---|---|
| 2700 | 10 | 21 | 25 | 45 |
| 3000 | 14 | 21 | 22 | 43 |
| 3500 | 17 | 25 | 27 | 30 |
| 4000 | 21 | 29 | 24 | 26 |
| 4500 | 28 | 27 | 22 | 22 |
| 5000 | 32 | 26 | 21 | 21 |
| 5700 | 37 | 23 | 19 | 21 |
| 6500 | 43 | 21 | 17 | 19 |

For convenience, each of the percentages in the table has been rounded to the nearest whole number.

A lighting fixture that has a material bearing one of the mixtures of Table 4 is expected to produce a white light output of a color temperature corresponding to the listed nominal color temperature, that is to say within the corresponding color temperature range of Table 1 and within the corresponding chromaticity quadrangle of Table 2. The combination of phosphors, however, is expected to also produce a white light that has a high quality spectral content, that is to say that approaches or corresponds to the black body radiation spectrum for the rated color temperature, over the 210 nm portion of the spectrum (e.g. from 450 nm to 660 nm). The percentages listed in Table 4 are given by way of example. Those skilled in the art will appreciate that even for the same four phosphors, some variation in the proportions/percentages of the different phosphors should produce similarly acceptable color/spectral performance in the light output of the device. Also, different phosphors will have different characteristic emission spectra and therefore would be mixed in different proportions.

Figure 3C:
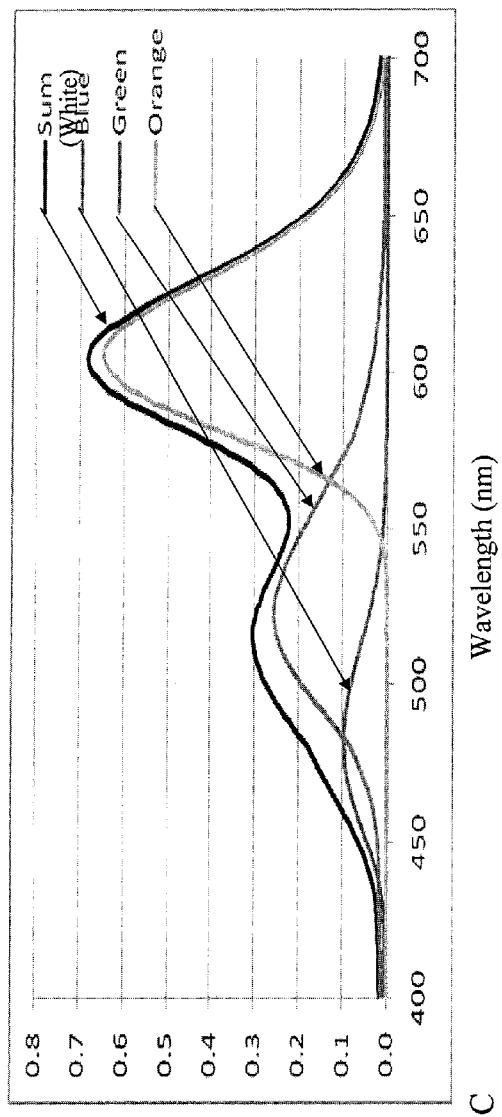
FIG. 3C is a graph of emission spectra of three of the doped semiconductor nanophosphors selected for use in an exemplary solid state light emitting device as well as the spectrum of the white light produced by combining the spectral emissions from those three phosphors.

FIG. 3C graphically depicts emission spectra of three of the doped semiconductor nanophosphors selected for use in an exemplary light fixture as well as the spectrum of the white light produced by summing or combining the spectral emissions from those three phosphors. For convenience, the emission spectrum of the LED has been omitted from FIG. 3C, on the assumption that a high percentage of the 405 nm light from the LED is absorbed by the phosphors. Although the actual output emissions from the fixture may include some near UV light from the LED, the contribution thereof if any to the sum in the output spectrum should be relatively small.

Although other combinations are possible, the example of FIG. 3C represents emissions of blue, green and orange phosphors. Light is additive. Where the fixture in system 30a, or 30b, for example, includes the blue, green and orange emitting doped semiconductor nanophosphors in FIG. 3A or 3B, the addition of the blue, green and orange emissions produces a combined spectrum as approximated by the top or 'Sum' curve in the graph of FIG. 3C.

It is possible to add one or more additional nanophosphors, e.g. a fourth, fifth, etc., to the mixture to further improve the CRI. For example, to improve the CRI of the nanophosphor mix of FIG. 3C, a doped semiconductor nanophosphor might be added to the mix with a broad emissions spectrum that is yellowish-green or greenish-yellow, that is to say with a peak of the phosphor emissions somewhere in the range of 540-570 nm, say at 555 nm.

Figure 3D:
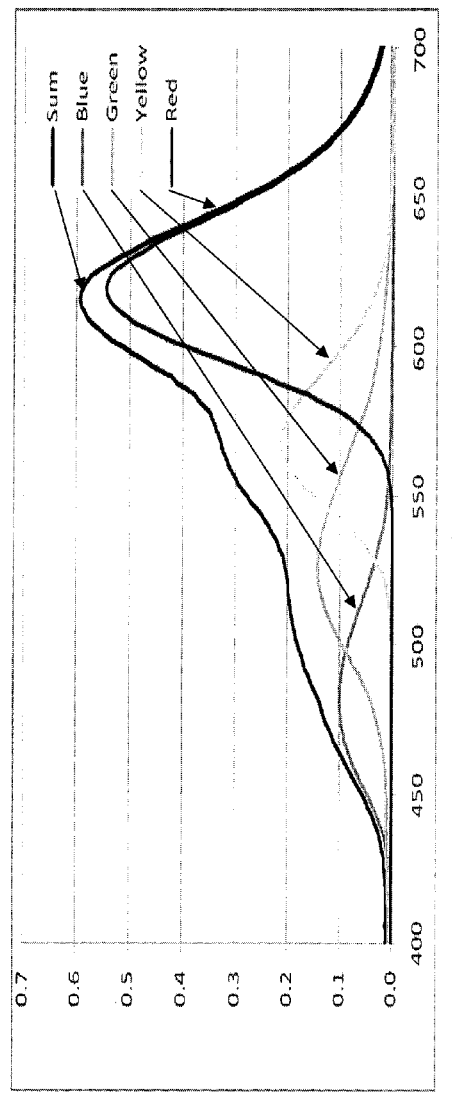
FIG. 3D is a graph of emission spectra of four doped semiconductor nanophosphors, in this case, for red, green, blue and yellow emissions, as the spectrum of the white light produced by combining the spectral emissions from those four phosphors.

Other mixtures also are possible, with two, three or more doped semiconductor nanophosphors. The example of FIG. 3D uses red, green and blue emitting semiconductor nanophosphors, as well as a yellow fourth doped semiconductor nanophosphor. Each absorption spectrum would include at least a portion of the 380-420 nm near UV range. All four phosphors would exhibit a large Stokes shift from the short wavelength(s) of absorbed light to the longer wavelengths of re-emitted light, and thus their emissions spectra have little or not overlap with the absorption spectra. As discussed above, the relative levels of the emission spectra and the sum curve assume select proportions or percentages of the phosphors in the mixture.

In this example (FIG. 3D), the blue nanophosphor exhibits an emission peak at or around 484 nm, the green nanophosphor exhibits an emission peak at or around 516 nm, the yellow nanophosphor exhibits an emission peak at or around 580, and the red nanophosphor exhibits an emission peak at or around 610 nm. The addition of these blue, green, red and yellow phosphor emissions produces a combined spectrum as approximated by the top or 'Sum' curve in the graph of FIG. 3D. The 'Sum' curve in the graph represents a resultant white light output having a color temperature of 2600° Kelvin (within the 2,725±145° Kelvin range), where that white output light also would have a CRI of 88.

Returning to the example in FIG. 3A or 3B, assume that the phosphors at 34c in the containment vessel/chambers 34a or 34b include the blue, green and orange emitting doped semiconductor nanophosphors. The semiconductor LED chip formed by layers 13 and 15 is rated to emit near UV electromagnetic energy of a wavelength in the 380-420 nm range, such as 405 nm, which is within the excitation spectrum of each of the three included phosphors in the mixture shown at 34c. When excited, that combination of doped semiconductor nanophosphors re-emits the various wavelengths of visible light represented by the blue, green and orange lines in the graph of FIG. 3C. Combination or addition thereof in the fixture output produces "white" light, which for purposes of our discussion herein is light that is at least substantially white light. The white light emission from the lighting fixture in 30a or 30b exhibits a CRI of 75 or higher. Also, the light output of the fixture exhibits color temperature of 2800° Kelvin, that is to say within the 2,725±145° Kelvin range. Other combinations of doped semiconductor nanophosphors can be used in a lighting fixture 30a or 30b to produce the high CRI white light in one of the following Kelvin ranges: 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; or 6,530±510° Kelvin.

The fixtures 30a and 30b provides a "remote" implementation of the phosphors, such as semiconductor nanophosphors, in that the phosphors are outside of the package enclosing the actual semiconductor chip or chips and thus are apart or remote from the semiconductor chip(s). The remote phosphors are provided in the containment vessel/chamber 34a or 34b positioned within lightguide 32a in any of a number of different ways, such as dispersed in a solid, liquid or gas transmissive material. Several different forms and locations of the phosphors are shown and described with regard to later examples. In the first examples of FIG. 3A or 3B, the containment vessels/chambers 34a and 34b extend across a portion of the volume within the cavity 37 of lightguide 32a within the path of energy emissions from the source(s) 31.

In the examples of FIGS. 2A and 2B, the containment vessel/chamber 34a may be a sealed glass container, the material of which is highly transmissive and exhibits a low absorption with respect to visible light and the relevant wavelength(s) of near UV energy. In certain examples, the interior of the containment vessel/chamber 34a is filled with the phosphor material 34c and its bearing liquid, solid or gaseous material. Any of a number of various sealing arrangements may be used, so as to maintain a good oxygen barrier and thereby shield the phosphors from oxygen. At least some phosphors degrade in the presence of oxygen, reducing the useful life of the phosphors. Hence, it is desirable to blocks out oxygen, to prolong useful life of the semiconductor nanophosphors. The containment vessel/chamber 34a can be fastened to one or more walls of the lightguide by way of a fastening plate (not shown) or alternatively, the containment vessel/chamber 34a is positioned within a space or gap of a solid optical volume 37. The space or gap essentially forms the cavity for the solid, liquid or gas material bearing the phosphor material.

The vessel/chamber is shown near the middle. However, the vessel/chamber housing the phosphor(s) may be at other elevations, e.g. closer to the aperture or closer to the back/upper part of the reflector. Other side to side locations may also be used.

The lighting fixture utilize a lightguide element 42a, an optical volume 47, phosphor containment vessel/chamber 44a, optical aperture 43, and cladding layer 42, together with the solid state sources 41 to form a light fixture 40. The light fixture 40 could be configured for a general lighting application. As shown in the lighting system 40 in FIG. 4, a control circuit 48 is coupled to the LED type semiconductor chip in each of sources 41, for establishing output intensity of electromagnetic energy output of the LED sources 41. The control circuit 48 typically includes a power supply circuit coupled to a voltage/current source, shown as an AC power source 46. Of course, batteries or other types of power sources may be used, and the control circuit 48 will provide the conversion of the source power to the voltage/current appropriate to the particular one or more LEDs 41 utilized in the system 40. The control circuit 48 includes one or more LED driver circuits for controlling the power applied to one or more sources 41 and thus the intensity of energy output of the source and thus of the fixture. The control circuit 48 may be responsive to a number of different control input signals, for example to one or more user inputs as shown by the arrow in FIG. 4, to turn power ON/OFF and/or to set a desired intensity level for the white light output provided by the system 40.

In the exemplary arrangement of the lighting system 40 (FIG. 4), when electromagnetic energy from the solid state sources 41 enters the interior volume of the cavity 47 it passes into the containment vessel/chamber 44a and through the transmissive material bearing the phosphors 44c. In FIG. 4, the containment vessel/chamber is slightly curved, as in the example of FIG. 3A, and contains a liquid transmissive carrier with the phosphors dispersed therein. Emissions from the solid state sources 41, enter the lightguide 42a directly, or reflect off of the reflector 45 and into the containment vessel/ chamber 44*a*. Within the containment vessel/chamber 44*a*, the energy from the solid state sources excites the phosphors 44*c* in the transmissive liquid material, to produce light that is at least substantially white, that exhibits a CRI of 85 or higher and that exhibits color temperature in one of the previously specified ranges. The containment vessel/chamber 44*a* can be fastened to one or more walls of the lightguide 42*a* by way of a fastening plate (not shown) or alternatively, the containment vessel/chamber 44*a* is positioned within a space or gap of a solid optical volume 47. The space or gap essentially forms the cavity for the solid, liquid or gas material bearing the phosphor material.

In the example of FIG. 4, the solid state sources 41 emit energy at a 405 nm wavelength. Light resulting from the phosphor excitation, essentially absorbed as near UV energy and reemitted as visible light of the wavelengths forming the desired white light, passes out through the containment vessel/chamber 44*a*. Some light emerges directly out of the fixture 40 through aperture 43 as represented by the undulating arrows. However, some of the white light will also reflect off of the reflective surface of the reflector 45 after passing through cladding layer 42. Some light may even pass through the containment vessel/chamber 44*a* and phosphor material 44*c* again before emission out of the lightguide 42*a* through the aperture 43. The macro reflector 45 is positioned to receive at least some of the emitted visible light from the lightguide element 44*a* and integrate the emitted visible light within the optical volume 47 for output by way of the optical aperture 43.

In the orientation illustrated in FIGS. 2A, 2B, 4, and 5, white light from the phosphor excitation, including any white light emissions reflected by the macro reflector (35, 45 or 65) are directed downwards, for example, for lighting a room or other habitable space below the fixture. The orientation shown, however, is purely illustrative. The lighting fixture or system may be oriented in any other direction appropriate for the desired lighting application, including upward, any sideways direction, various intermediate angles, etc. Those skilled in the art will recognize, however, that the principles of that example are applicable to lighting fixtures or systems of other shapes and configurations, including various straight or curved reflective surfaces (e.g. hemispherical, semi-cylindrical, parabolic, etc.).

Those skilled in the art will also recognize that the lighting applications described herein could include a variety of other optical processing elements, such as a further reflector, one or more lenses, a diffuser, a collimator, etc.

Figure 5:
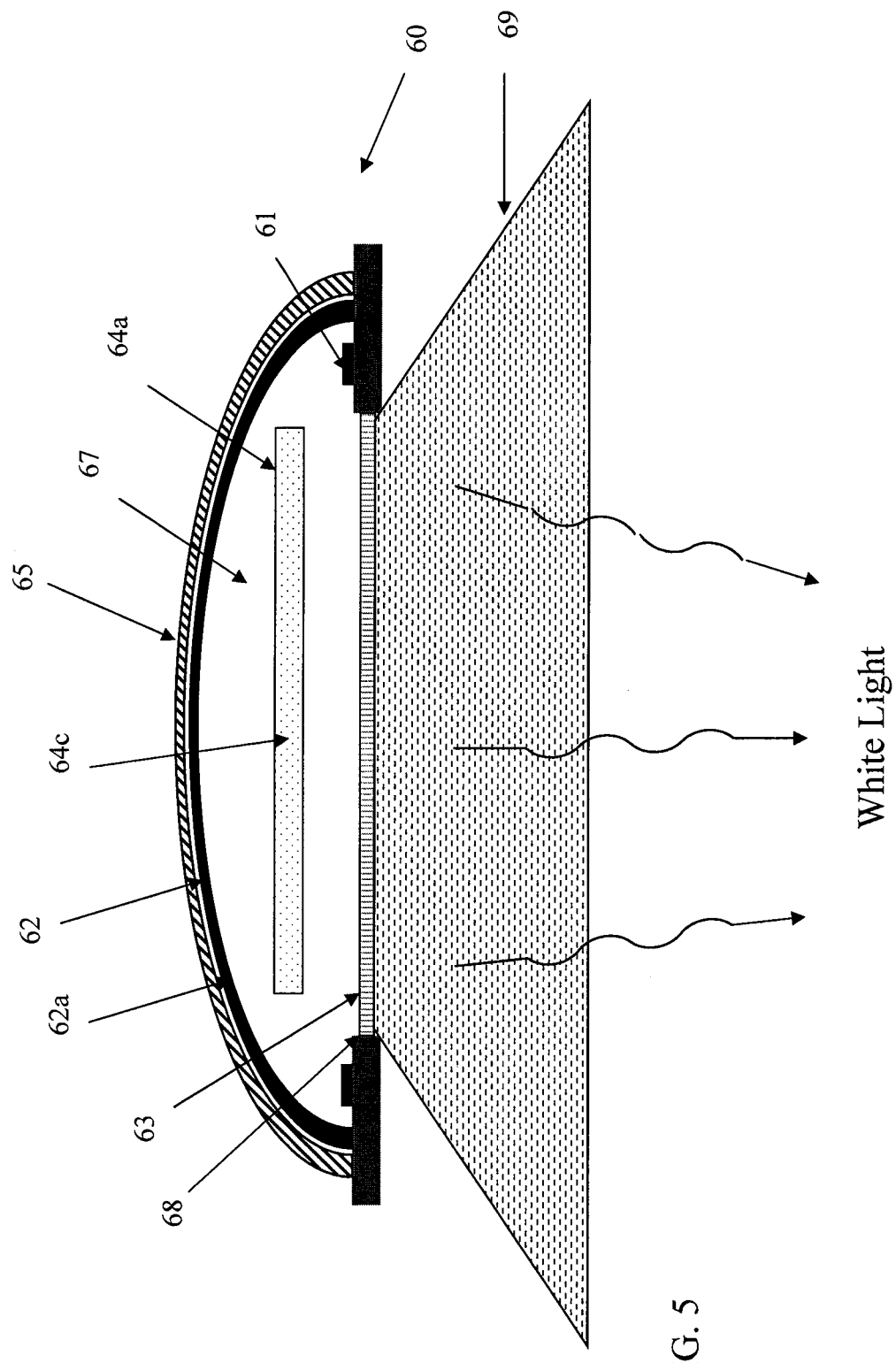
FIG. 5 illustrates an example of a white light emitting fixture, similar to that of FIG. 4, but using a deflector, with certain elements thereof shown in cross-section.

FIG. 5 illustrates yet another lighting system 60 that may utilize solid state sources and a phosphor material, such as doped semiconductor nanophosphors, for emitting visible light for white light type general lighting applications. The illustrated fixture 60 includes a lightguide 62*a*, cladding layer 62, optical volume 67 and macro reflector 65. The cavity 67 is similar to that of cavity 47 in FIG. 4, and the fixture 60 may include an additional optical element for processing the output light. As in the earlier examples, the phosphors 64*c* are remotely implemented, that is to say dispersed in the containment vessel/chamber 64*a*. In this example, the containment vessel/chamber includes a gas or solid transmissive material with phosphors dispersed therein. The containment vessel/chamber 64*a* may be fixedly secured to one or more walls of the lightguide 62*a* by a plate member(s) (not shown) or positioned in the approximate middle of a solid optical volume 67. It is noted that the cladding layer 62 may not be needed assuming the difference in refractive index between the material and air is sufficient enough to produce total internal reflection.

The vessel/chamber is shown near the middle. However, the vessel/chamber housing the phosphor(s) may be at other elevations, e.g. closer to the aperture or closer to the back/upper part of the reflector. Other side to side locations may also be used.

Reflector 65 having a diffusely reflective surface extending over a surface of the lightguide element 62*a*, with an air cladding or low index refractive cladding layer 62, positioned between the reflector 65 and the surface of the lightguide element 62*a*. The lightguide element 62*a* may have various shapes, but compressed or elongated hemispherical shapes, as shown by example in FIGS. 4 and 5, for the volume of the lightguide 62*a* and thus the reflective surface(s) thereof are shown and discussed, most often for convenience. Examples having shapes corresponding to a portion or segment of a sphere or cylinder are preferred for ease of illustration and/or because curved surfaces provide better efficiencies than other shapes that include more edges and corners which tend to trap light. Those skilled in the art will understand, however, that the volume of the lightguide of the fixture, may have any shape providing adequate reflections within the volume/cavity for a particular lighting application. In the example, the lightguide 62*a* is in the shape of a hemispherical dome, includes a substantially flat aperture 63 and containment vessel/chamber 64*a* positioned in approximately the middle of cavity 67. At least the interior facing surface of surface 68 surrounding the solid state sources 61 is highly diffusely reflective, so that the resulting lightguide 62*a* is highly diffusely reflective with respect to the electromagnetic energy spectrum produced by the fixture 60, particularly that in the spectral range for the intended white light output. The surface 68 further masks direct view of the solid state sources 61 by any person in that region.

Elements of the macro reflector 65 may be formed of a diffusely reflective plastic material, having a 97% or higher reflectivity and a diffuse reflective characteristic. Examples of such materials include Valar™ and WhiteOptics™. Another example of a material with a suitable reflectivity at or approaching 99% is Spectralon™. Alternatively, the reflector may comprise a rigid substrate having an interior surface, and a diffusely reflective coating layer formed on the interior surface of the substrate so as to provide the diffusely reflective interior surface facing cavity 67. The coating, for example, might be Duraflect™. Alternatively, the coating layer might take the form of a flat-white paint or white powder coat.

The optical aperture 63, as with the optical apertures 33, 43 in the preceding examples, is a light passage for allowing emission of light. The optical aperture 63 approximates a circle, although other shapes are possible. In the example, the aperture 63 is a physical passage or opening through the approximate center between the solid state sources 61. Those skilled in the art will recognize, however, that the intent is to allow efficient passage of light out of the cavity 67, and therefore the optical aperture 63 may be through some other device or material that is transmissive to the relevant wavelengths. For example, the aperture may be formed of a diffuser and/or a filter. If implemented as a filter, the filter at the aperture might allow passage of visible light, but block UV emissions from the cavity. In this example, the solid state sources 61 produce electromagnetic energy at or below 460 nm, in particular a 405 nm wavelength. A plurality of sources 61 of near UV radiant energy, similar to the solid state source 11 in FIG. 1. Although any solid state source producing energy in the range of $\lambda \leq 460$ nm may be used, for purposes of further discussion of this example, we will assume that the sources are near UV LEDs 61 rated to produce near UV light energy at or about 405 nm. Two of the 405 nm LEDs 61 are visible in the illustrated cross-section of FIG. 5. The LEDs are generally similar to the LED type source 11 of FIG. 1. Any number of such LEDs 61 may be used. The LEDs 61 supply 405 nm light into the interior cavity 67 of the lightguide 62a. As shown, the points of emission into the interior of the optical integrating cavity are not directly visible from outside the fixture through the aperture 63 due to the masking nature of surface 68.

In this example, 405 nm near UV light outputs of the LED sources 61 are coupled directly to openings at points in the interior of the lightguide 62a, to emit near UV light directly into the interior of the lightguide 62a. For ease of construction/illustration, however, the exemplary openings for the LEDs 61 are formed through the surface 68. Of course, the LEDs or other solid state sources may be coupled to the points for entry of energy into the cavity 67 of the lightguide element in any other manner that is convenient and/or facilitates a particular system application. As an example, the sources 61 may be coupled to the openings into the cavity 67 via a light guide or pipe or by an optical fiber.

In the lighting fixture 60 of FIG. 5, the cavity 67 of lightguide element 62a accommodates containment vessel/chamber 64a which contains phosphors 64c, like those discussed above relative to FIG. 2B. The phosphors are dispersed in the bearer gas or solid materials discussed above relative to the example of FIG. 3B. In the example of FIG. 5, the phosphor is dispersed in a solid or gas transmissive material. Again, each of the phosphors is excitable by the 405 nm near UV energy from the LED sources 61. Each such phosphor used in the fixture 60 emits light in a different spectrum, such as respective ones of the orange, green and blue spectra discussed above. Such spectra do not overlap with the absorption spectra of the phosphors. When all of the various types of phosphors used are excited by the 405 nm near UV energy, the phosphors together produce light that is at least substantially white and has a color rendering index (CRI) of 75 or higher. The light output of the fixture 60 produced by this near UV excitation of the phosphors in the containment vessel/chamber 64a may exhibit color temperature of 2,725±145° Kelvin; 3,045±175° Kelvin; 3,465±245° Kelvin; 3,985±275° Kelvin; 4,503±243° Kelvin; 5,028±283° Kelvin; 5,665±355° Kelvin; or 6,530±510° Kelvin.

At some point on one or more passes through the containment vessel/chamber 64a, photons of the 405 nm energy impact and excite particles of the phosphors contained in the containment vessel/chamber 64a. When so excited, the phosphor particles re-emit electromagnetic energy, but now of the wavelengths for the desired visible spectrum for the intended white light output. The visible light produced by the excitation of the phosphor particles diffusely reflects one or more times off of the reflective surfaces of reflector 65. This diffuse reflection within the cavity integrates the light produced by the semiconductor nanophosphor excitation to form integrated light of the desired characteristics at the optical aperture 63 providing a substantially uniform output distribution of integrated light (e.g. substantially Lambertian).

Pixelation and color striation are problems with many prior solid state lighting devices. When a non-cavity type LED fixture output is observed, the light output from individual LEDs or the like appear as identifiable/individual point sources or 'pixels.' Even with diffusers or other forms of common mixing, the pixels of the sources are apparent. The observable output of such a prior system exhibits a high maximum-to-minimum intensity ratio. In systems using multiple light color sources, e.g. RGB LEDs, unless observed from a substantial distance from the fixture, the light from the fixture often exhibits striations or separation bands of different colors. Although this is not as pronounced with systems using only one color of LED, there may still be separation band issues. In systems using an integrating cavity 67 and containment vessel/chamber 64a, in the example of FIG. 5, however, the converts the point source output(s) and light resulting from excitation of the semiconductor nanophosphor in the containment vessel/chamber 64a to a virtual source output of light, at the effective optical aperture 63, which is free of pixilation or striations.

Semiconductor nanophosphors, such as the doped semiconductor nanophosphors used in the more specific examples, produce relatively uniform repeatable performance somewhat independent of the rated wavelength of the source, so long as within the excitation spectrum. Thus, having chosen appropriate phosphors to produce light of the desired CRI and color temperature, fixtures using that phosphor formulation will consistently produce white light having the CRI in the same range and color temperature in the same range with little or not humanly perceptible variation from one fixture to another. In this way, the use of the semiconductor nanophosphors to produce the actual white light masks any variation in the wavelengths of electromagnetic energy produced by different solid state sources (even though the solid state sources may be rated to produce the same color of light).

The fixture 60 also includes a control circuit (not shown) as described above for FIG. 4, coupled to the 405 nm LEDs 61 for establishing output intensity of electromagnetic energy generated by each of the LED type solid state sources. The control circuit typically includes a power supply circuit coupled to a source, shown as an AC power source, although those skilled in the art will recognize that batteries or other power sources may be used. In its simplest form, the circuit includes a common driver circuit to convert power from source to the voltages/current appropriate to drive the LEDs 61 at an output intensity specified by a control input to the circuit. The control input may indicate a desired ON/OFF state and/or provide a variable intensity control setting. The control circuit may be responsive to a number of different control input signals, for example, to one or more user inputs. Although not shown in this simple example, feedback may also be provided.

The optical aperture 63 may serve as the light output of the fixture, directing substantially white light of the desired characteristics and relatively uniform intensity distribution to a desired area or region to be illuminated in accord with a particular general lighting application of the fixture. For some applications, the fixture 60 includes an additional deflector or other optical processing element, e.g. to distribute and/or limit the light output to a desired field of illumination. In the example of FIG. 5, the fixture 60 also utilizes a deflector 69 having a reflective inner surface, to efficiently direct most of the light emerging from the virtual light source at optical aperture 63 into a somewhat narrow field of illumination. The deflector further processes light output from the lightguide element 62a. A small opening at a proximal end of the deflector 69 is coupled to the optical aperture 63. The deflector 69 has a larger opening at a distal end thereof. Although other shapes may be used, in the example the deflector is conical. The angle and distal opening size of the conical deflector 69 define an angular field of electromagnetic energy emission from the system 60. Although not shown, the large opening of the deflector may be covered with a transparent plate, a diffuser or a lens, or covered with a grating, to prevent entry of dirt or debris through the cone into the system and/or to further process the output white light. Alternatively, the deflector could be filled with a solid light transmissive material of desirable properties.

The conical deflector 69 may have a variety of different shapes, depending on the particular lighting application. In the example, where the cavity 67 is hemispherical and the optical aperture 63 is circular, the cross-section of the conical deflector is typically circular. However, the deflector may be somewhat oval in shape. Even if the aperture 63 and the proximal opening are circular, the deflector may be contoured to have a rectangular or square distal opening. In applications using a semi-cylindrical cavity, the deflector may be elongated or even rectangular in cross-section. The shape of the optical aperture 63 also may vary, but will typically match the shape of the small end opening of the deflector 69. Hence, in the example the optical aperture 63 would be circular. However, for a device with a semi-cylindrical cavity and a deflector with a rectangular cross-section, the optical aperture may be rectangular.

The deflector 69 comprises a reflective interior surface between the distal end and the proximal end. In some examples, at least a substantial portion of the reflective interior surface of the conical deflector 69 exhibits specular reflectivity with respect to the integrated electromagnetic energy. For some applications, it may be desirable to construct the deflector 69 so that at least some portions of the inner surface 69 exhibit diffuse reflectivity or exhibit a different degree of specular reflectivity (e.g. quasi-specular), so as to tailor the performance of the deflector 69 to the particular application. For other applications, it may also be desirable for the entire interior surface of the deflector 69 to have a diffuse reflective characteristic. In such cases, the deflector 69 may be constructed using materials similar to those taught above for construction of the reflector 65. The large end of the deflector may be larger or smaller than shown in FIG. 5. The size, angle and shape of the deflector 69 determine the area or region that will be illuminated by the combined or integrated light emitted from the cavity 67 via the optical aperture 63.

FIGS. 6A and 6B illustrate other examples of lighting fixtures. FIG. 6A is similar to FIG. 4 in terms of the positioning of the solid state sources 71, the containment vessel/chamber 77a and macro reflector 75. The circuitry 77 for driving solid state sources 71 is similar to that described above for FIG. 4. In FIGS. 6A and 6B a parabolic shaped specular mirror 76 is position around the edges of the lightguide element 72a. The parabolic shaped specular mirror 76 is positioned to receive some of the electromagnetic energy from the solid state sources 71 positioned below the parabolic shaped specular mirror 76. The parabolic shaped specular mirror 76 faces back inside the lightguide 72a and allow electromagnetic energy from the solid state sources 71 to pass into the lightguide 72a, as shown by the directional arrow. In this example, the lightguide element 72a together with the parabolic shaped specular mirror 76 is configured so that energy from the sources 71 passes through the element at a relatively shallow angle and, as a result, total internal reflection (TIR) can be realized. Hence, electromagnetic energy from the sources 71 and reflected off of the parabolic shaped specular mirror 76, will pass and reflect back and forth within the lightguide element 72, but relatively little of that source energy will emerge pass through the aperture 73 without having first passed one or more times through the containment vessel/chamber 77a, which contains one or more phosphor materials for excitation by the source energy. Thus, a majority of the solid state source energy is absorbed by the phosphor material before it reaches the other side of the lightguide element 72a. Integrated light that has passed through the containment vessel/chamber 77a and excited phosphors contained therein, is able to exit through the aperture 73 at a steeper angle.

In FIG. 6B, a similar configuration of a lighting fixture is depicted. However, the lightguide element does not have parallel sides as shown in FIG. 6A. Rather, in this example the two facing sides are angled with the center section of the lightguide element being the widest. The width begins to decrease as the sides approach solid state sources 71 and the parabolic shaped specular mirror 76. Thus, light reflecting off a surface adjacent to the thicker middle section of the lightguide element 72a tends to be trapped within the lightguide, whereas light reflecting off a surface further away from the middle will less likely be trapped within the lightguide element 42a. As shown by the directional arrow A in FIG. 6B, energy from the solid state source 71 reflects off of parabolic shaped specular mirror 76, passes through containment vessel/chamber 77a and reflects near the middle section (thickest point) of the lightguide element 72a and is internally reflected back into the lightguide element. Directional arrow A then passes through containment vessel/chamber 77a and excites additional phosphor light which reflects off of a macro reflector 75 before passing through aperture 73. Directional arrow B illustrates an example of excited phosphor light exiting the containment vessel/chamber 77 and reflecting off of a surface further away from the middle section of the lightguide element 72a, i.e. at a thinner section of the lightguide element, before passing out through the aperture 73 at a steeper angle.

The LED coupling illustrated in FIG. 6B, could alternatively be arranged as shown in FIGS. 2A and 2B. The LEDs may be optically indexed matched or non-indexed matched. Further, the tapered configuration shown in FIG. 6B is designed such that phosphor emitted light can exit the lightguide element. Light from the solid state sources impact lightguide surface at a relatively shallow angle and is maintained or is trapped (total internal reflection) within the lightguide. Light directly emitted from the source(s) would hit a surface of the lightguide at a shallow angle so as to reflect and stay confined within the lightguide core. With the configuration shown in FIG. 6B, substantial amounts of light emitted by the excited phosphor(s) in the containment/vessel 77a, however, is not subject to the total internal reflection and therefore passes through the aperture surface of the lightguide core at a steeper angle. Thus, light generated by phosphor excitations within the light guide impacts surfaces at steeper angles and is therefore able to escape the lightguide. The shape of the lightguide in FIG. 6B can be altered such that the upper portion (opposite the aperture) is uniformly angled, and the aperture surface is relatively flat. Moreover, the tapered surface illustrated in FIG. 6B may be more of a curved surface. One or ordinary skill in the art would be able to adjust the overall shape of the lightguide so long as the pumped light from the solid state sources is maintained inside the lightguide until the light is absorbed by the phosphor and then allowed to escape at a relatively steeper angle.

The solid state sources in any of the systems discussed above may be driven by any known or available circuitry that is sufficient to provide adequate power to drive the semiconductor devices therein at the level or levels appropriate to the lighting application of each particular fixture. Analog and digital circuits for controlling operations and driving the emitters are contemplated, and power may be derived from DC or AC sources. Those skilled in the art should be familiar with various suitable circuits. For many white light applications, the control circuitry may offer relatively simple user control, e.g. just ON/OFF or possibly with some rudimentary dimmer functionality. For example, in a general lighting application, a triac dimmable driver may be used to provide DC drive current from an AC power source. Such a driver offers ON/OFF control as well as level setting control responsive to triac variations of the AC waveform from a standard type dimmer unit.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A lighting fixture, comprising:
a macro reflector including a diffusely reflective surface forming an optical volume;
an optical aperture for emission of visible light out of the fixture to facilitate a visible light illumination application in a region or area to be inhabited by a person;
a lightguide element substantially filling the optical volume;
a solid state source coupled to the lightguide element and configured to emit electromagnetic energy into the lightguide element, the solid state source comprising a semiconductor chip, an internal reflector, a housing and a light transmissive part, the housing and the light transmissive part together forming a package with the chip and the internal reflector enclosed within the package, wherein the macro reflector and the lightguide element are outside the package of the solid state source;
a sealed chamber formed within the lightguide element external to and at a distance from the package of the solid state source and coupled to receive electromagnetic energy from the solid state source through at least a portion of the lightguide element;
a material contained in and at least substantially filling the sealed chamber; and
at least one remote phosphor, external to the package of the solid state source and dispersed in the material contained in the chamber, at a location for excitation by the electromagnetic energy from the solid state source, each phosphor having an absorption spectrum encompassing an emission spectrum of the solid state source for emitting visible light into the optical volume,
wherein the macro reflector is positioned to receive at least some of the emitted visible light from the lightguide element and integrate the emitted visible light within the optical volume for output by way of the optical aperture.

2. The lighting fixture of claim 1, wherein the solid state source is an ultraviolet (UV) or near ultraviolet solid state source, and the semiconductor chip is configured for producing UV or near UV electromagnetic energy.

3. The lighting fixture of claim 2, wherein the semiconductor chip comprises a light emitting diode (LED) for producing energy at a wavelength ($\lambda$) of $\leq 460$ nm.

4. The lighting fixture of claim 1, wherein at least one remote phosphor is a semiconductor nanophosphor.

5. The lighting fixture of claim 4, wherein at least one remote phosphor is a doped semiconductor nanophosphor.

6. The lighting fixture of claim 1, wherein:
the material bearing the phosphor dispersed therein is a solid, and
the material bearing the phosphor dispersed therein appears at least substantially clear when the solid state source is off.

7. The lighting fixture of claim 1, wherein:
the material bearing the phosphor dispersed therein is a liquid and the chamber is curved, and
the material bearing the phosphor dispersed therein appears at least substantially clear when the solid state source is off.

8. The lighting fixture of claim 1, wherein:
the material bearing the phosphor dispersed therein is a gas, the gas comprises one gas or a combination of gases each selected from the group consisting of: hydrogen gas, insert gases, and hydrocarbon based gases, and
the material bearing the phosphor dispersed therein appears at least substantially clear when the solid state source is off.

9. The lighting fixture according to claim 1, further comprising:
a cladding layer interposed between the macro reflector and the exterior perimeter of the lightguide element.

10. The lighting fixture of claim 1, wherein the macro reflector further extends to opposite sides of the optical aperture.

11. The lighting fixture of claim 1, wherein:
the solid state source is optically indexed matched with the lightguide element, and
the lightguide element comprises four acute angled corners.

12. The lighting fixture of claim 1, wherein the solid state source comprises:
a plurality of solid state sources positioned around the optical aperture.

13. The lighting fixture of claim 12, further comprising:
a controller coupled to each of the plurality of the solid state sources configured to enable adjustment of intensity of the electromagnetic energy of the first spectrum emitted by the solid state sources.

14. The lighting fixture of claim 1, wherein the solid state source comprises:
a plurality of solid state sources positioned between the macro reflector and optical aperture.

15. The lighting fixture of claim 1, further comprising:
a controller coupled to the solid state source configured to enable adjustment of intensity of the electromagnetic energy of the first spectrum emitted by the solid state source.

16. A lighting fixture, comprising:
a plurality of solid state sources, each solid state source comprising a semiconductor chip, an internal reflector, a housing and a light transmissive part, the housing and the light transmissive part together forming a package with the chip and the internal reflector enclosed within the package;
a macro reflector external to the packages of the solid state sources coupled to receive light from the solid state sources, the macro reflector including a diffusely reflective surface forming an optical volume and an optical aperture for emission of visible light out of the fixture to facilitate a visible light illumination application in a region or area to be inhabited by a person;
a lightguide element substantially filling the optical volume,
wherein the lightguide element is external to the packages of the solid state sources;
a sealed chamber formed within the lightguide element and coupled to receive electromagnetic energy from the solid state sources through at least a portion of the lightguide element, the chamber being external to and at a distance from the packages of the solid state sources;

a material contained in and at least substantially filling the sealed chamber;

a plurality of remote phosphors, external to the packages of the solid state sources and dispersed in the material contained within the chamber at a location for excitation by the electromagnetic energy from the solid state sources for emitting visible light into the optical volume, each of the phosphors having a respective absorption spectrum encompassing an emission spectrum of the solid state sources; and a controller, coupled to each of the plurality of the solid state sources, configured to enable adjustment of intensity of the electromagnetic energy emitted by the solid state sources, wherein the macro reflector is positioned to receive at least some of the emitted visible light from the lightguide element and integrate the emitted visible light within the optical volume for output by way of the optical aperture.

17. The lighting fixture according to claim 16, wherein:
the visible light output from the fixture is at least substantially white; and
the visible light output from the fixture has a color rendering index (CRI) of 75 or higher.

18. The lighting fixture according to claim 16, wherein the phosphors in the chamber comprise a plurality of semiconductor nanophosphors.

19. The lighting fixture according to claim 18, wherein:
the semiconductor chips comprise light emitting diodes for producing energy at a wavelength ($\lambda$) of $\leq 460$ nm; and
emissions of the semiconductor nanophosphors cause the visible light output of the fixture to have a color temperature in one of the following ranges:
2,725±145° Kelvin,
3,045±175° Kelvin,
3,465±245° Kelvin,
3,985±275° Kelvin,
4,503±243° Kelvin,
5,028±283° Kelvin,
5,665±355° Kelvin, or
6,530±510° Kelvin.

* * * * *